United States Patent [19]
Miyahara

[11] Patent Number: 5,629,559
[45] Date of Patent: May 13, 1997

[54] PACKAGE FOR SEMICONDUCTOR DEVICE

[75] Inventor: Kenichiro Miyahara, Tokuyama, Japan

[73] Assignee: Tokuyama Corporation, Yamaguchi-ken, Japan

[21] Appl. No.: 347,484

[22] PCT Filed: Apr. 6, 1994

[86] PCT No.: PCT/JP94/00571

§ 371 Date: Dec. 6, 1994

§ 102(e) Date: Dec. 6, 1994

[87] PCT Pub. No.: WO94/23448

PCT Pub. Date: Oct. 13, 1994

[30] Foreign Application Priority Data

| Apr. 6, 1993 | [JP] | Japan | 5-079675 |
| Dec. 15, 1993 | [JP] | Japan | 5-315382 |

[51] Int. Cl.⁶ .................................................. H01L 23/52
[52] U.S. Cl. .................. 257/666; 257/691; 257/692; 257/700
[58] Field of Search .................. 257/787, 666, 257/691, 692, 704, 700

[56] References Cited

U.S. PATENT DOCUMENTS

| 5,196,725 | 3/1993 | Mita et al. | 257/666 |
| 5,220,195 | 6/1993 | McShane et al. | 257/666 |
| 5,399,804 | 3/1995 | Yoneda et al. | 257/787 |

FOREIGN PATENT DOCUMENTS

| 56-26784 | 9/1982 | Japan | 257/666.2 |
| 3-8362 | 1/1991 | Japan | 257/666.2 |
| 4-352463 | 12/1992 | Japan . | |
| 5-129514 | 5/1993 | Japan | 257/666.2 |
| 5-291453 | 11/1993 | Japan . | |

*Primary Examiner*—Sara W. Crane
*Assistant Examiner*—Roy Potter
*Attorney, Agent, or Firm*—Birch, Stewart, Kolasch & Birch, LLP

[57] ABSTRACT

The present invention provides a package for mounting of semiconductor device, wherein:

(a) a power layer, a ground layer and a signal layer are laminated via an intermediate layer including an insulating layer, (b) the power layer and the ground layer are each constituted by an inner lead area, an outer lead area and an electro-conductive area, the inner lead area and the outer lead area being not covered with the intermediate layer and being exposed and the electro-conductive area being interposed between the inner lead area and the outer lead area and covered with the intermediate layer, and (c) substantially all of the electro-conductive area of each of the power layer and the ground layer is constituted by a planar electro-conductive member. In this package, the self-inductances of the power layer and the ground layer are low and the capacitor formed by these layers has a large capacity; therefore, the power line and ground line noise is reduced.

21 Claims, 11 Drawing Sheets

- outer leads
- inner lead
- throughholes

- lead 5 of signal layer
- adhesive tape 7a
- adhesive tape 7b
- 5 signal layer
- 4 power layer
- 3 ground layer
- 9 sealing resin
- throughholes 15 outer lead area
12 inner lead area
14 electro-conductive area 15 outer lead area
12 inner lead area
14 electro-conductive area

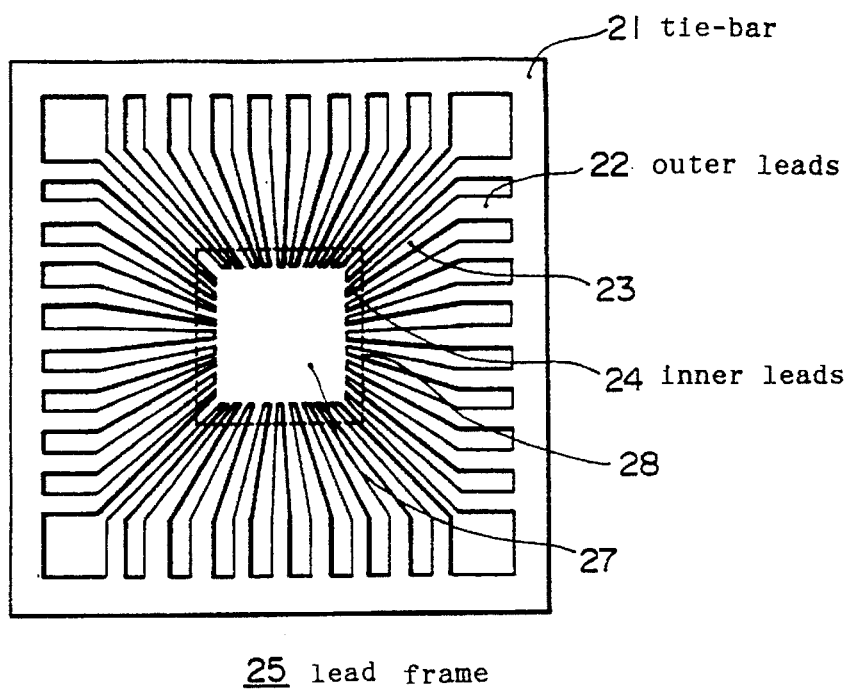
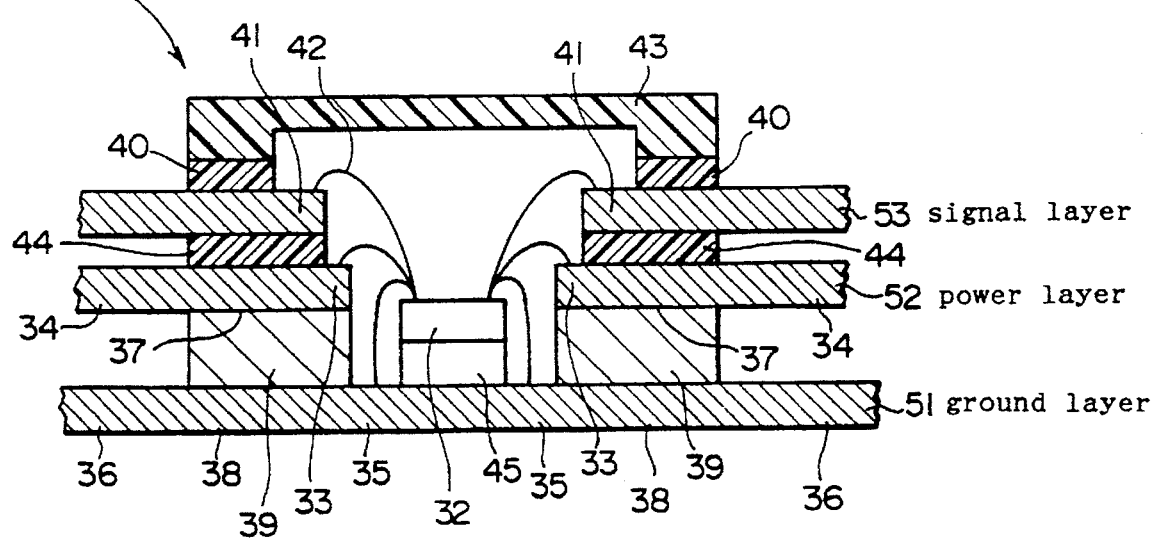

PACKAGE FOR SEMICONDUCTOR DEVICE

TECHNICAL FIELD

The present invention relates to a novel package for mounting of semiconductor device. More particularly, the present invention relates to a package for mounting of semiconductor device, which gives reduced simultaneous switching noise to semiconductor devices and which can effectively prevent the adverse effect of the noise generating in the vicinity of the package, particularly the noise generating in the power line and the ground line, on the semiconductor device.

BACKGROUND ART

The operation of the semiconductor devices used in microprocessors, gate arrays, etc. has become increasingly fast in recent years, and the limit of the frequency allowing for the operation of microprocessor has now reached 200 MHz. This limit of the frequency allowing for said operation is anticipated to become increasingly high in the future. As the operational frequency becomes high, the semiconductor device is adversely affected more easily by the noise generating in the vicinity thereof, particularly the noise generating in the power line and the ground line.

Under the above circumstance, there was proposed a three-layer package for mounting of semiconductor device. In FIG. 1a is shown a schematic sectional view when a semiconductor device is mounted in the three-layer package. The package is constituted by a power layer 3, a ground layer 4 and a signal layer 5. The power layer and the ground layer are revered in some cases. The three layers are bonded with an adhesive tape 7. The adhesive tape 7 acts also as an insulating layer. In the three-layer package, a semiconductor device 2 is mounted; the semiconductor device is electrically connected with each layer of the package by the use of bonding wires 6; the outer leads 8 of the signal layer are used as leads for electrical connection with the outside. That is, the electrical connection of the power layer 3 and the ground layer 4 with the outside is conducted by their connection with one or more of the fine outer leads 8 of the signal layer. The semiconductor device and the package, including the above connected portions and a part of the outer leads 8, are sealed with a resin 9.

In such a three-layer package, the power layer and the ground layer have many throughholes formed therein.

In FIG. 1b is shown a schematic plane view of a typical example of the power layer or the ground layer. In FIG. 1b, the power layer or the ground layer has a square shape and has outer leads around the outside. There is an electro-conductive portion between the outer leads and the Inner lead formed in the shape of a frame In the center of the power layer or the ground layer, and many throughholes are formed in the electro-conductive portion.

The adhesive tape 7 acting also as an insulating layer adheres to the sealing resin through the above throughholes, and further the adhesive tape 7 present in the form of two layers adhere to each other through the throughholes, whereby a three-layer structure is formed. This state is appreciated by referring to FIG. 1c which is a schematic sectional view of the package.

That is, in FIG. 1c, the adhesive tape 7a and the adhesive tape 7b are bonded through the throughholes and act so as to laminate the signal layer 5, the power layer 3 and the ground layer 4 more solidly.

In such a three-layer package, the self-inductances of the power layer and the ground layer are relatively low and the power line and ground line noise is relatively low.

It is, however, desired to develop a package for mounting of semiconductor device, in which the power line and ground line noise is lower.

DISCLOSURE OF THE INVENTION

The present inventor made a research in order to develop a package in which the power line and ground line noise is lower. As a result, the present inventor found out the following facts and completed the present invention.

(1) In the conventional three-layer package, the throughholes formed in the power layer and the ground layer act so as to increase the self-inductances of these layers. By eliminating the throughholes, the power line and ground line noise can be reduced.

(2) It was feared that the elimination of the throughholes might weaken the bonding between the layers and consequently the maintenance of the laminated structure might become impossible. However, the appropriate arrangement of an adhesive layer can provide a strong laminated structure. Further, the strength of this laminated structure can be maintained sufficiently even when the whole laminated structure is substantially not sealed with a resin.

(3) As a result, it is possible to constitute a package comprising a power layer and a ground layer each having no throughholes in the electro-conductive area. Further, since no resin sealing is conducted, a linear electro-conductive portion present in the sealed portion can be eliminated substantially. Thus, reduction in self-inductance is achieved and a package very low in the power line and ground line noise can be obtained.

Hence, an object of the present invention is to provide a novel package for mounting of semiconductor device, which has a low power line and ground line noise.

Other object of the present invention is to provide a multilayered package for mounting of semiconductor device, which has the power layer and the ground layer independently from the signal layer and in which the self-inductances of the power layer and the ground layer are low.

Still other object of the present invention is to provide the above multilayered package capable of forming a capacitor of high capacity between the power layer and the ground layer.

According to the present invention, there is comprehensively provided a package for mounting of semiconductor device, wherein:

(a) a power layer, a ground layer and a signal layer are laminated via an intermediate layer including an insulating layer, (b) the power layer and the ground layer are each constituted by an inner lead area, an outer lead area and an electro-conductive area, the inner lead area and the outer lead area being not covered with the intermediate layer to be exposed and the electro-conductive area being interposed between the inner lead area and the outer lead area and covered with the intermediate layer, and (c) substantially all of the electro-conductive area of each of the power layer and the ground layer is constituted by a planar electro-conductive member. This package achieves the above objects of the present invention.

BRIEF DESCRIPTION OF THE DRAWINGS

FIG. 6 is a schematic plan view showing a lead frame usable as the signal layer of the package of the present invention for mounting of semiconductor device.

FIG. 7 is a schematic sectional view showing an embodiment of the package of the present invention for mounting of semiconductor device.

BEST MODE FOR CARRYING OUT THE INVENTION

Figure 1:
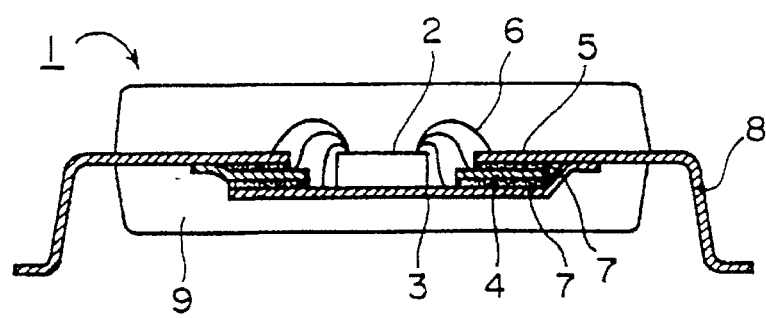
FIG. 1a is a schematic sectional view showing the conventional three-layered package for mounting of semiconductor device.
FIG. 1b is a schematic plan view showing a typical example of the power layer or the ground layer in the conventional three-layered package for mounting of semiconductor device.
FIG. 1c is a schematic sectional view showing part of the conventional three-layered package for mounting of semiconductor device.
FIG. 1d is a schematic sectional view showing the conventional three-layered package for mounting of semiconductor device, produced for comparing with the package of the present invention for mounting of semiconductor device.
Figure 1:
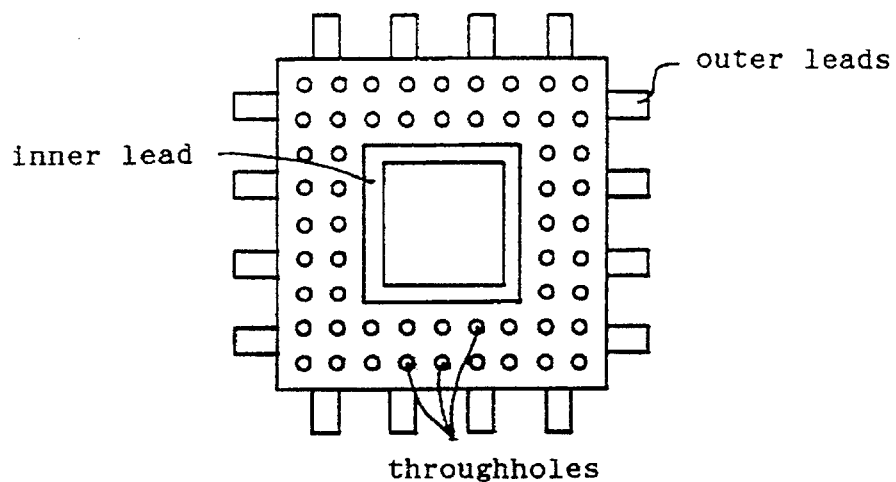
Figure 1:
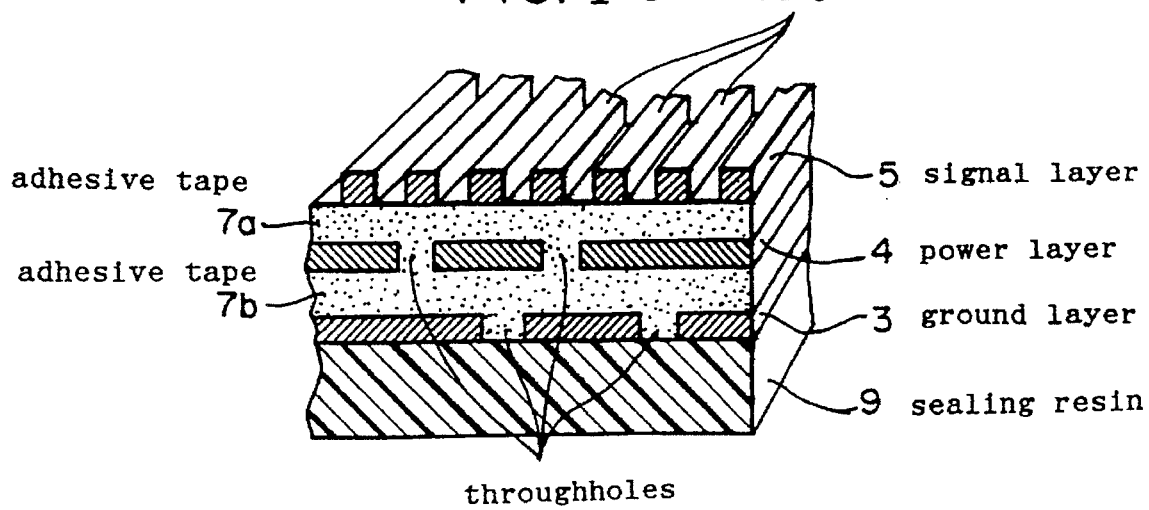
Figure 1:
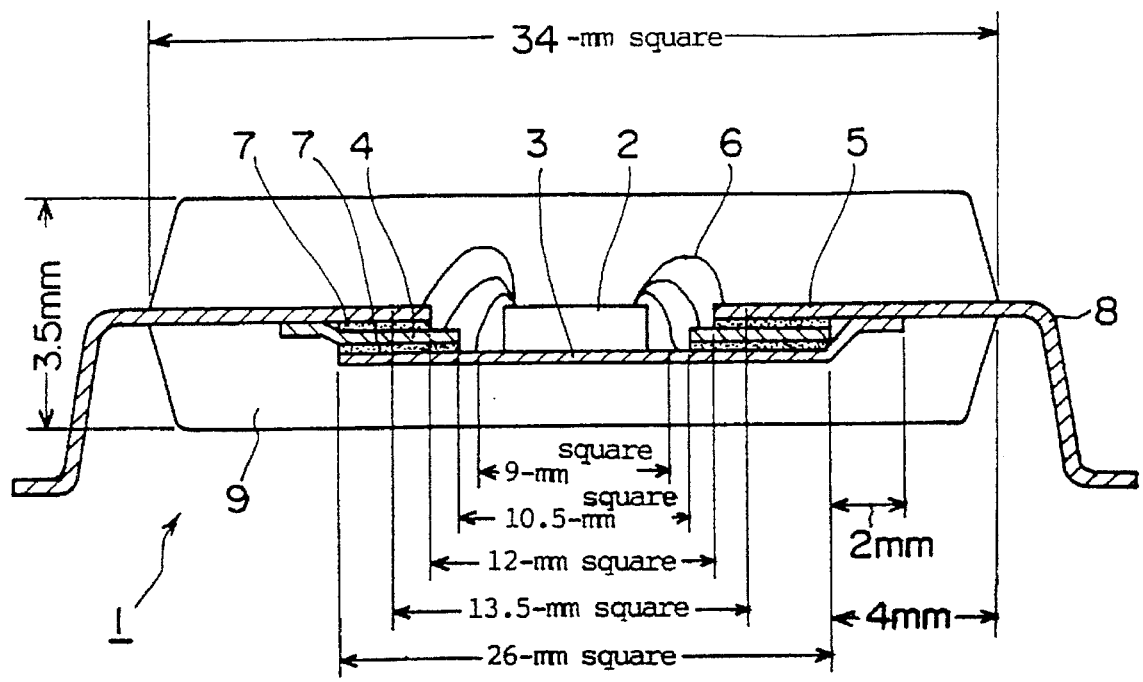

In order to first describe the present invention in brief, one embodiment of the package of the present invention is described referring to FIG. 7. FIG. 7 is a schematic sectional view showing one embodiment of the present package.

In FIG. 7, a power layer 52 is laminated on a ground layer 51 via an insulating layer (a ceramic layer) 39 which becomes an intermediate layer. Thereon is further laminated a signal layer via an insulating layer (an adhesive layer) 44.

In the ground layer 51, there are formed an outer lead area 36 and an inner lead area 35 both not covered with the insulating layer 39 and being exposed and, between these areas, there is formed a planar electro-conductive area 38. The electro-conductive area 38 is covered with the insulating layer 39.

In the power layer 52, there are formed an outer lead area 34 and an inner lead area 33 both not covered with the insulating layer 44 to be exposed and, between these areas, there is formed a planar electro-conductive area 37. The electro-conductive area 37 is covered with the insulating layer 44.

Each of the electro-conductive area 38 in the ground layer 51 and the electro-conductive area 37 in the power layer 52 is substantially constituted by an electro-conductive member.

The present invention is hereinafter described in detail, whereby the other objects, constitution, advantages and meritorious effects of the present invention will become apparent.

In the present package, the power layer and the ground layer are each constituted by an inner lead area, an outer lead area and an electro-conductive area interposed between the two areas.

These inner lead area and outer lead area are not covered with an insulating layer laminated with the power layer or the ground layer and are exposed, and the electro-conductive area is covered with the insulating layer.

Figure 2:
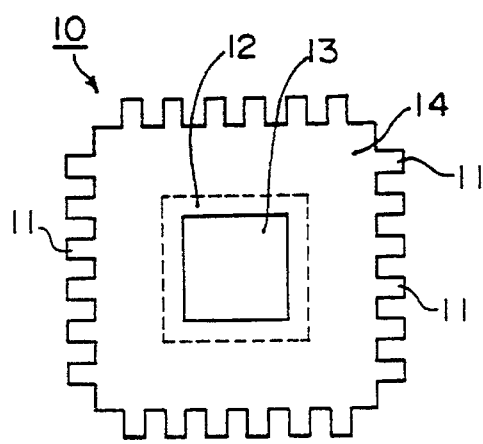
FIG. 2 is a schematic plan view showing a typical example of the power layer or the ground layer in the package of the present invention.

FIG. 2 shows a schematic plan view of one typical example of the power layer or the ground layer. In the power layer or the ground layer represented by 10, there are a plurality of outer leads 11 around the outside, which constitute an outer lead area; the intermediate area surrounded by a dotted line and a solid line is an inner lead area 12 in which inner leads are present; and the area interposed between said two areas is an electro-conductive area 14. The area 13 surrounded by the solid line is a site at which a semiconductor device is located. There is a case that no area 13 is present.

Figure 3:
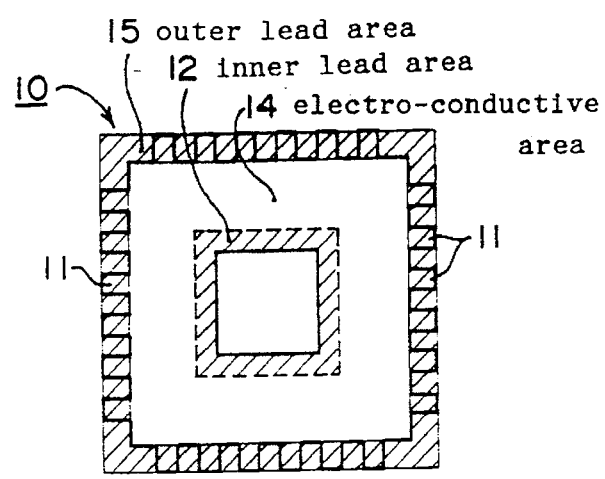
FIG. 3 is a view for explaining the inner lead area, outer lead area and electro-conductive area of the power layer or the ground layer.

In order to make clearer the definitions of the inner lead area, outer lead area and electro-conductive area of the present invention, these areas are explained by referring to FIG. 3. That is, in the power layer or ground layer 10, the inner lead area is a planar area 12 which is interposed between a frame surrounded by a solid line and a frame surrounded by a dotted line and in which hatching is applied. The outer lead area is an area 15 in which hatching is applied and outer leads 11 are present. The area interposed between the outer lead area 15 and the inner lead area is an electro-conductive area 14, and an electro-conductive member is present therein.

The inner lead area 12 and the outer lead area 15 are not covered with the intermediate layer laminated with the power layer or the ground layer and are exposed, and the electro-conductive area 14 is covered with the intermediate layer.

The leads of the Inner lead area and the leads of the outer lead area are electrically connected by a planar electro-conductive member having substantially no throughhole, present in the electro-conductive area 14. That is, substantially all of the electro-conductive area 14 is constituted by a planar (e.g. flat plane) electro-conductive member. Therefore, there is substantially no throughhole (seen in FIG. 1b) present in the electro-conductive areas of the power layer and the ground layer in the conventional three-layer package.

Further, the power layer, the ground layer (these two layers each have an electro-conductive layer) and the signal layer are strongly bonded and laminated by the use of an adhesive layer of the intermediate layer described in detail later. Therefore, reinforcement with a sealing resin as conducted conventionally is not necessary. As a result, the linear electro-conductive portions present in the sealed portion of the conventional package can be eliminated substantially.

Thus, in the package of the present invention for mounting of semiconductor device, (i) the electro-conductive areas of the power layer and the ground layer have substantially no electrical defect, and further (ii) there can be eliminated the linear electro-conductive portions connected with the power layer and the ground layer, present in the sealed portion of the conventional package. Therefore, the self-inductances of the power layer and the ground layer can be reduced in the present package.

That is, the self-inductances of the power layer and the ground layer in the present package can be made as low as 2 nH or less, preferably 1 nH or less.

Herein, the self-inductance of the power layer or the ground layer is:

(1) when the leads (in signal layer) not used for signal line are electrically connected with the outer leads of the ground layer or the power layer, a value measured between the inner leads and the portion of said leads (in signal layer) not used for signal line, located 1 mm outside from the outer periphery of the intermediate layer contacting with the signal layer, and (2) when the outer leads of the ground layer or the power layer are independent from the signal layer, a value measured between the inner leads and the portion of said outer leads located 1 mm outside from the outer periphery of the intermediate layer contacting with the ground layer or the power layer.

However, when the present package is sealed with a molded resin similarly to the conventional package, the self-inductance of the power layer or the ground layer is a value measured between the inner leads and the portion of leads located 1 mm outside from the outer periphery of the molded sealing resin.

Moreover in the present package, as described later, a capacitor of high capacity, for example, 500 pF or more (e.g. 500–1,000 pF) can be formed between the power layer and the ground layer.

The multi-layer package of the present invention for mounting of semiconductor device has, therefore, very low noise level in power line and ground line, as compared with the conventional package.

Figure 4:
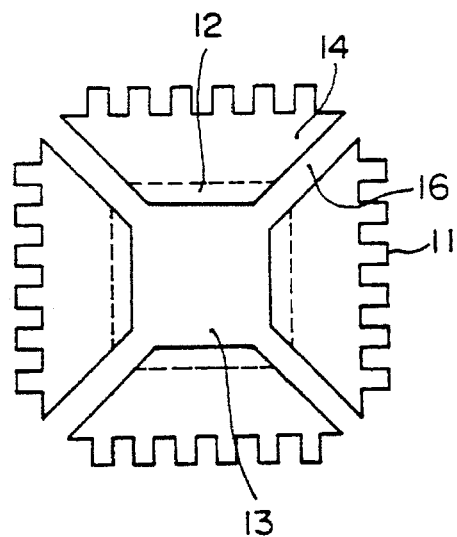
FIG. 4 is a schematic plan view showing a power layer or a ground layer, each of which may be used In the package of the present invention.

FIG. 4 is a schematic plan view showing an example of the power layer or the ground layer, which is divided by small gaps.

Figure 5:
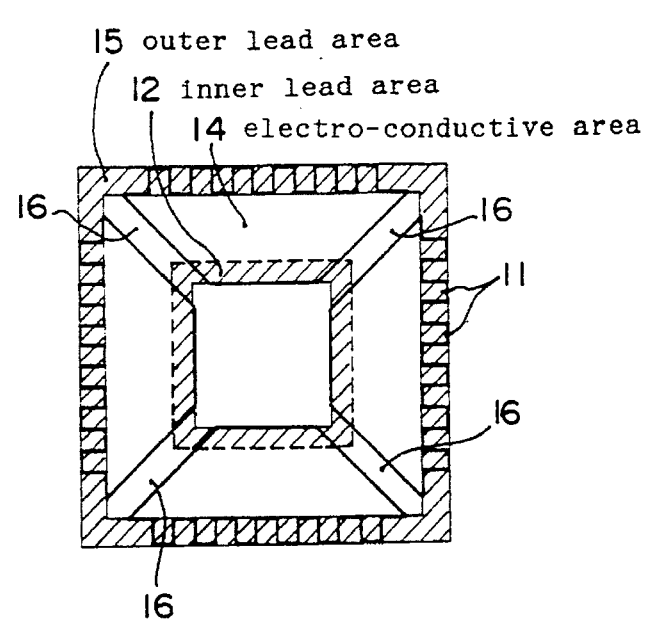
FIG. 5 is a view for explaining the electro-conductive area of the power layer of the ground layer each shown in FIG. 4.

The electro-conductive area of the above example is shown by FIG. 5. That is, in FIG. 5, an electro-conductive area 14 is present as an area interposed between an inner lead area 12 of frame shape surrounded by a dotted line and indicated by hatching and an outer lead area 15 indicated by hatching and including outer leads 11. In the electro-conductive area is present an electro-conductive member containing non-electro-conductive gaps 16 slightly. Of the electro-conductive area 14, the area excluding the non-electro-conductive gaps 16 is constituted by an electro-conductive member. When the non-electro-conductive gaps 16 have a very small area, the power layer or the ground layer shown in FIG. 4 can be used in the package of the present invention.

In general, when at least 90%, preferably at least 95% of the electro-conductive area 14 is constituted by a planar electro-conductive member, such a power layer or a ground layer can be used as the power layer or the ground layer of the present invention.

In the package of the present invention for mounting of semiconductor device, the shape of the inner leads present in each inner lead area of the power layer and the ground layer is not particularly restricted as long as the inner leads constitute terminals for connecting with the semiconductor device. As the shape of the inner leads, there can be mentioned, for example, a linear shape and a planar shape. Inner leads of planar shape may each have a hole therein. Inner leads of planar shape are particularly preferable because, with such inner leads, it is unnecessary to provide a bonding pad for wire bonding.

There is no particular restriction as to the outer leads present in each outer lead area of the power layer and the ground layer, as long as the outer leads constitute terminals capable of being electrically connected with the circuit wires leading to the power source and the ground. The outer leads are, as necessary, bonded to the outer leads of the signal layer not used for signal line, and the bonded outer leads are bent in the form of gull wing, J-bend lead or the like.

By bonding the outer leads of the power layer and the ground layer to some of the signal layer leads not used for signal line, a capacitor is formed between the above signal layer leads not used for signal line and the ground layer or the power layer adjacent to the signal layer. A capacitor is also formed between the signal layer leads not used for signal line, to which the outer leads of the power layer and the ground layer are bonded. The formation of these capacitors brings about an increase in the capacity of the capacitor between the power layer and the ground layer and produces a favorable result.

Each thickness of the power layer and the ground layer is preferably 1–1,000 μm, particularly preferably 10–300 μm in order to obtain a low self-inductance and a thinner package.

As the signal layer of the present invention, there can be used a signal layer (a lead frame) used in the conventional mono-layer or multi-layer package for mounting of semiconductor device. As shown in FIG. 6, in the signal layer, a plurality of inner leads are electrically connected with a plurality of outer leads by linear electro-conductive members.

In FIG. 6 is shown a schematic plan view of a typical example of the signal layer. In FIG. 6, outer leads 22 are fixed by the use of a tie-bar 21 so that each lead is maintained at a given position. The tie-bar 21 is cut and removed after a semiconductor device is mounted. The electrical signals from the outer leads 22 are sent to the semiconductor device via the electro-conductive areas 23, the inner leads 24 and the bonding wires (not shown).

The material constituting each of the power layer, the ground layer and the signal layer is not particularly restricted as long as it is electrically conductive, and preferably has a melting point of 400° C. or more. Such a high melting point can prevent the melting of the material in, for example, the bonding of semiconductor device to package, the thermal ball bonding for wire bonding, the cap-sealing of semiconductor device-mounted package.

Preferable as such a material having electric conductivity and a melting point of 400° C. or more are pure metals such as Au, Ag, Cu, Al, W, Mo, Mn, Ni, Fe, Co, Be, Cr, Ir, Rh, Pt, Pd, Os and the like, as well as alloys containing at least one of said metals. Preferable as the material for each of the power layer and the ground layer are pure metals of low magnetic permeability, such as Au, Ag, Cu, Al, W, Mo, Nn and the like, as well as alloys containing at least one of said metals, for a smaller self-inductance.

Of these, a material of Cu type or Cu alloy type is preferable when the insulating layer is made of a ceramic, because the material can be strongly bonded to the ceramic by the use of an inorganic adhesive such as brazing agent or the like. Specific examples of the material are oxygen-free copper, tough pitch copper, Cu—Sn type alloys (e.g. EFTEC-3S), Cu—Zr alloys (e.g. CA-151), Cu—Fe alloys (e.g. CA-194) and phosphor bronze.

When the intermediate layer between the power layer and the ground layer is constituted by an insulating layer made of a polyimide resin, a fluororesin or the like and an organic adhesive layer, Al or an Al alloy can be preferably used as the material for each of the power layer and the ground layer.

When a metal of low bondability to the adhesive layer of the intermediate layer is used as the material for the power layer or the ground layer, it is possible to form, on the surface of the metal, a metal layer of good bondability to said adhesive layer by a means such as plating, vapor deposition, cladding or the like.

Since the signal layer is not required to have a low self-inductance, the material for the signal layer can be selected from a wide range of materials. As specific examples, there can preferably be mentioned Fe—Ni alloys (e.g. 42% Ni-remainder of Fe), Co—Ni—Fe alloys [e.g. Kovar® (25–34% Ni-15–20% Co-remainder of Fe)], Cu and Cu alloys.

The surfaces of the Inner leads and outer leads of each of the power layer, the ground layer and the signal layer are subjected to various treatments in order to improve the wire-bonding property, etc. The treatments have no particular restrictions. In the package of the present invention for mounting of semiconductor device, the power layer and the ground layer can each be formed as one or more layers.

The signal layer is preferably located outside of the power layer and the ground layer because such arrangement allows for the formation of a capacitor of high capacity between the power layer and the ground layer. Therefore, the orders of lamination of the power layer, the ground layer and the signal layer are typically as follows.

(1) The ground layer, the power layer and the signal layer.
(2) The power layer, the ground layer and the signal layer.
(3) The ground layer, the power layer, the ground layer and the signal layer.

In the package of the present invention, there is present an intermediate layer between each two adjacent layers of the above.

In the package of the present invention, the intermediate layer containing an insulating layer, formed between the power layer and the ground layer has the following four types.

The first type intermediate layer comprises a ceramic layer as an insulating layer and an inorganic adhesive layer.

As the ceramic as an Insulating layer, a ceramic having a heat conductivity (300K) of 1 W/m.k or more is preferable because it can allow the present package to have a higher heat-spreadability. Such a preferable ceramic can be exemplified by glass ceramic, mullite, zircon, forsterite, steatite, silica glass, Vycor glass, partially stabilized zirconia, silicon nitride, alumina, aluminum nitride, silicon carbide, magnesia, beryllia, boron nitride and diamond. Of these, most preferable are aluminum nitride and alumina both having even sufficient mechanical strengths.

When the main component of the ceramic is alumina, the preferable proportion of alumina in the ceramic is generally 80–99.9% by weight. The alumina may contain, for example, a sintering aid such as MgO, CaO, $SiO_2$, $TiO_2$ or the like and a coloring agent such as $Cr_2O_3$, $MoO_3$, CoO, $MnO_2$, $Fe_2O_3$ or the like.

When the main component of the ceramic is aluminum nitride, the preferable proportion of aluminum nitride in the ceramic is 80–99.9% by weight. The aluminum nitride may contain, for example, a sintering aid such as IIA group element compound (e.g. CaO or SrO), IIIA group element compound (e.g. $Y_2O_3$, $Dy_2O_3$, $Ho_2O_3$, $Er_2O_3$ or $Yb_2O_3$) and a coloring compound (e.g. $WO_3$, $MoO_3$, $TiO_2$, $V_2O_5$, $Nb_2O_5$, $Co_3O_4$ or NiO).

With such a ceramic can be constituted the insulating layer present in the intermediate layer between the power layer and the ground layer. The thickness of the ceramic layer as insulating layer has no particular restriction but is preferably 30 µm or more, particularly preferably 100–500 µm. When the thickness is more than 30 µm or more, there is an advantage that the bonding between the power layer and the ground layer can be conducted easily.

A package of such an embodiment, particularly a package in which the electro-conductive member of each of the power layer and the ground layer is made of copper or a copper alloy and the main component of the ceramic is alumina or aluminum nitride, is preferable because the package has high heat-spreadability, the difference in thermal expansion coefficient between the electro-conductive area and the ceramic layer (the insulating layer) is small, and the package is highly resistant to temperature change. Such a package is preferably used particularly as a package for semiconductor device of high speed and high power consumption, for example, as a package for microprocessor, ECL gate array or the like.

The bonding of the ceramic to the power layer or the ground layer can be conducted by the use of an inorganic adhesive such as low-melting lead type glass, lead borosilicate type glass or the like; an inorganic adhesive having conductivity, such as Ag-glass (a mixture of said glass and an Ag component) or the like; or a metallic adhesive having conductivity, made of a noble metal brazing alloy such as Ag—Cu brazing alloy (e.g. Ag: 15–85% by weight, Cu: 15–85% by weight), Ag—Cu—Ti brazing alloy (e.g. Ag: 15–85% by weight, Cu: 15–85% by weight, Ti: 0.05–20% by weight), Ag—Cu—Zr brazing alloy (e.g. Ag: 15–85% by weight, Cu: 15–85% by weight, Zr: 0.05–20% by weight), Au—Cu brazing alloy or the like. These inorganic adhesives are heated to 700°–1,100° C. in vacuum or in a non-oxidizing atmosphere ($N_2$, $H_2$, Ar, He or a mixed gas thereof) to bond the power layer or the ground layer to the ceramic layer.

The thus-obtained bonding between the ceramic layer (the insulating layer) and the power layer or the ground layer has a high adhesion strength. The adhesion strength is 1 kg/cm or more in terms of 90° peeling strength. Thus, since the bonding between the ceramic layer (the insulating layer) and the power layer or the ground layer is strong, there are required no throughholes which are provided in the power layer and the ground layer of the conventional three-layer package in order to obtain a high adhesion strength, and an electro-conductive member substantially free from any throughhole can be allowed to be present in the electro-conductive area.

When the main component of the ceramic layer is aluminum nitride, it is preferable that the surface of the ceramic layer, particularly the surface of the ceramic layer to contact with the planar electro-conductive area of the power or ground layer be covered with an oxidized layer. As a result, the bonding strength between the ceramic layer and the electro-conductive member can be Increased. The thickness of the oxidized layer is preferably 0.1–10 μm.

In FIGS. 7 to 11 are shown schematic sectional views of several packages, in each of which the intermediate layer between the power layer and the ground layer is constituted by a ceramic insulating layer and an inorganic adhesive layer.

In the package 31 of FIG. 7, on one side of a frame-shaped ceramic layer 39 is present the electro-conductive area 37 of a power layer 52, interposed between the outer lead area 34 and the inner lead area 33 both of the power layer 52.

The electro-conductive member of the electro-conductive area 87 is bonded to the ceramic layer 39 via a thin inorganic adhesive layer (not shown). On other side of the ceramic layer 39 is present the electro-conductive area 38 of a ground layer 51, interposed between the outer lead area 36 and the inner lead area 35 both of the ground layer 51.

The electro-conductive member of the electro-conductive area 38 is bonded to the ceramic layer 39 via a thin adhesive layer (not shown).

The inner lead area of the power layer 52 has a frame shape. A semiconductor device 32 is fixed onto the area surrounded by the inner lead area 35 of the ground layer 51 via a ceramic insulating layer or a layer 45 made of a metal of low thermal expansion such as molybdenum or the like. On the electro-conductive area 37 of the power layer 52 is provided a signal layer 53 via an insulating layer 44. The insulating layer 44 is constituted by an insulating organic polymer described later. The semiconductor device 32 is bonded, by wires, to the inner leads of each of the ground layer 51, the power layer 52 and the signal layer 53. On the signal layer 53 is provided a cap 43 having a dent, via a sealant 40. In place of providing such a cap, it is possible to provide a frame via the sealant 40 and fill the resulting cavity with a potting sealant, followed by curing. The outer surface of the ground layer may be exposed as shown in FIG. 7, or may be covered with a ceramic or other insulating material.

Figure 8:
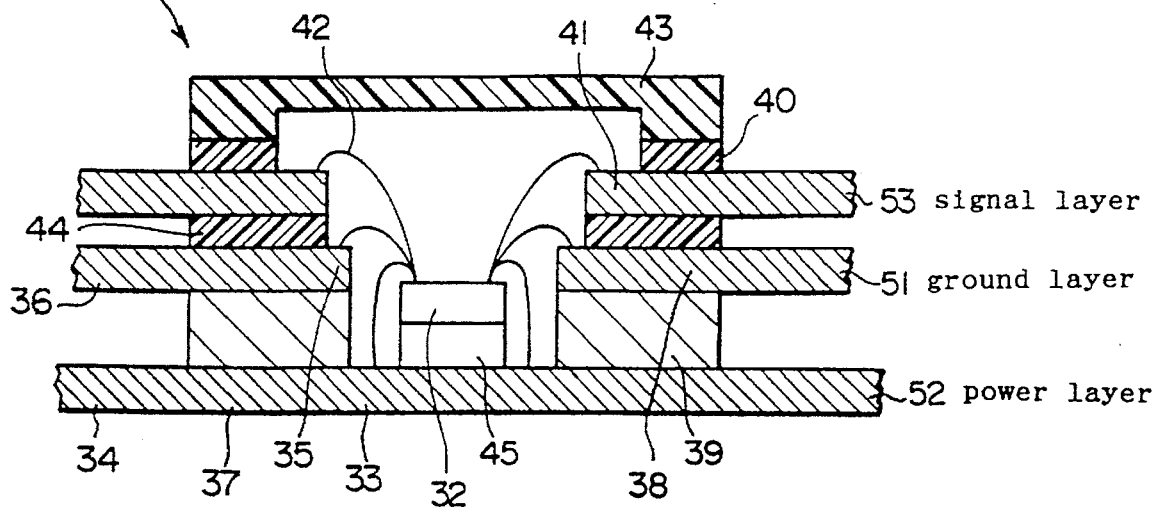
FIG. 8 is a schematic sectional view showing an embodiment of the package of the present invention for mounting of semiconductor device.
Figure 9:
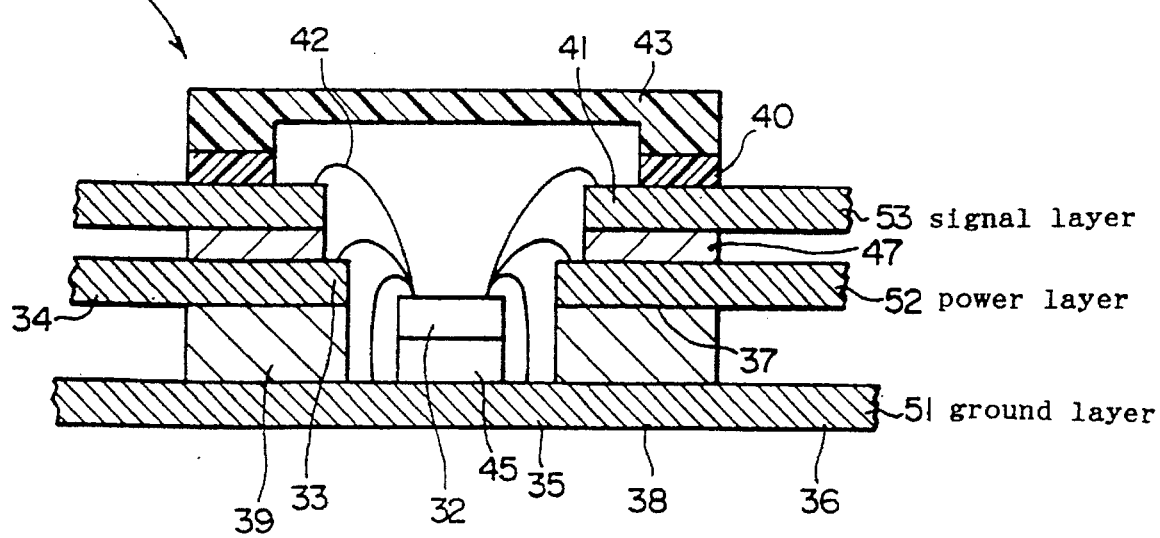
FIG. 9 is a schematic sectional view showing an embodiment of the package of the present invention for mounting of semiconductor device.

The package 46 shown in FIG. 8 is a package in which the power layer and the ground layer are reversed in FIG. 7. Since the ground layer is provided right below the signal layer, the package gives low cross-talk noise. Also, since the power layer has no throughholes, low self-inductance is obtained.

In any case, by bonding some of the outer leads of the signal layer, not used for signal line, to the outer leads of the ground layer by a means such as soldering, welding or the like, there is obtained a structure in which leads for grounding are provided between the leads for signal, of the signal layer, resulting in further reduced cross-talk noise. In the package 48 shown in FIG. 9, a signal layer 53 is provided on a power layer 52 via a ceramic insulating layer 47. Except for that, the package has the same structure as the package shown in FIG. 7. In the package 48, it is possible to provide a terminating resistance for lower reflection noise, between the outer leads of the signal layer 53 and the outer leads 36 of a ground layer 51.

Figure 10:
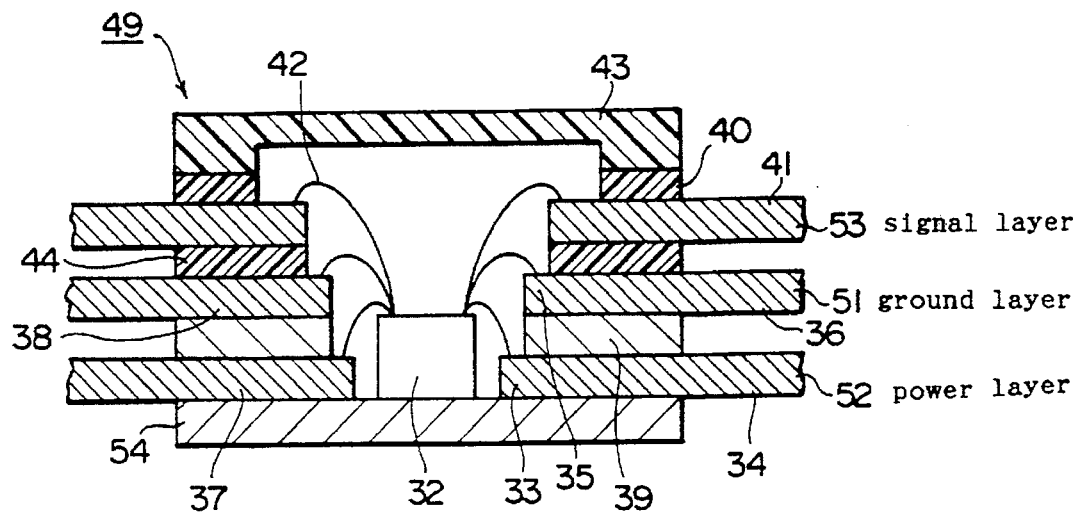
FIG. 10 is a schematic sectional view showing an embodiment of the package of the present invention for mounting of semiconductor device.

In the package 49 shown in FIG. 10, a ground layer 51 and a power layer 52 are formed on a ceramic layer 54 (which is a substrate) and therefore have a frame shape. The space surrounded by the inner lead area 33 of the power layer 52 is blocked with the ceramic layer 54 (the substrate). On the ceramic layer 54 is fixed a semiconductor device 32. Except for the above, the structure of the package 49 is the same as that of the package 46 shown in FIG. 8.

In the package 49, an insulating layer 44 can be a ceramic layer.

Figure 11:
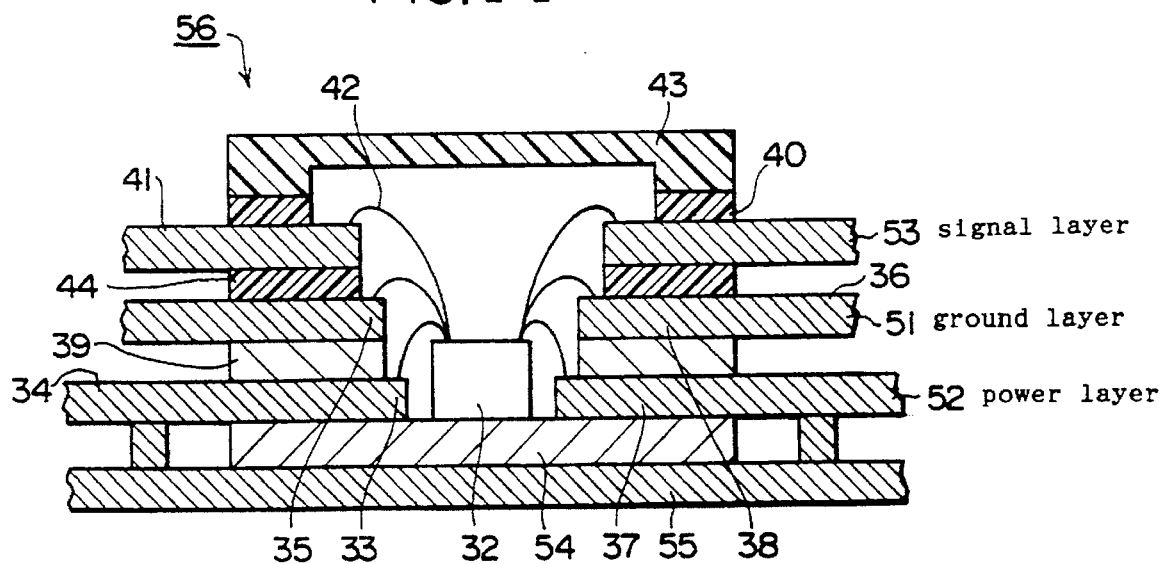
FIG. 11 is a schematic sectional view showing an embodiment of the package of the present invention for mounting of semiconductor device.

The package 56 shown in FIG. 11 has a structure in which, in the package 49 shown in FIG. 10, an electro-conductive layer 55 for power is bonded to a ceramic layer 54 on which a semiconductor device 32 is fixed. The electro-conductive layer 55 for power and the outer leads 34 of a power layer 52 are electrically connected outside the package. The outer surface of the electro-conductive layer 55 for power may be exposed, or may be covered with an insulating material such as ceramic or the like.

The second type intermediate layer between the power layer and the ground layer comprises an organic adhesive layer and an insulating layer present in the adhesive layer, preferably nearly in the middle of the adhesive layer.

As the insulating layer, there can be mentioned a thin ceramic plate, a resin film and a metal plate whose both surfaces are covered with a metal oxide film or an insulating resin film.

Figure 12:
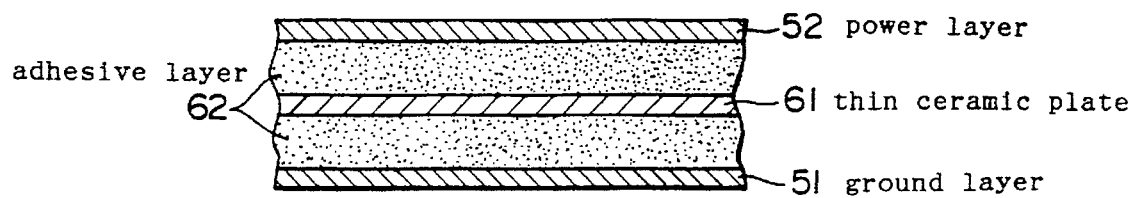
FIG. 12 is a schematic sectional view showing an example of the intermediate layer between the power layer and the ground layer.

FIG. 12 is a schematic sectional view when an insulating layer 61 is provided nearly in the middle of an adhesive layer 62 and the resulting Intermediate layer is provided between a power layer and a ground layer.

As the thin ceramic plate, there can be used those mentioned previously. As the resin film, there can be mentioned those made of a silicone resin, a polyurethane resin, an epoxy resin, an acrylic resin, a polyamide resin, a polyamide resin, a fluororesin, a phenolic resin, a polyester resin (a polyethylene terephthalate resin), a polyacetal resin, a polycarbonate resin, a polysulfone resin, a polyarylate resin, a polyether ketone resin, a polyphenylene sulfide resin or the like.

As the metal plate whose both surfaces are covered with a metal oxide film, there can be mentioned, for example, thin plates of Al, Cu, Mg, Ti, Zr, Nb, Ta or an alloy containing these metals, the both surfaces of which plates are covered with a film of an oxide of a metal such as Mg, Al, Ti, Zr, Hf, Nb, Ta or the like. The formation of the oxide film can be conducted by a known method described later.

As the thin metal plate whose both surfaces are covered with an insulating resin film, there can be mentioned plates of a metal or alloy such as Al, Cu, Ni, 42% Ni—Fe alloy, Kovar or the like, the both surfaces of which plates are covered with a resin such as silicone resin, epoxy resin, fluororesin, polyphenylene sulfide resin, polyester resin or the like.

When there is used, as the insulating layer, a metal plate whose both surfaces are covered with a metal oxide film or an insulating resin film, the thickness thereof is preferably 0.5–500 μm. Use of, in particular, a metal plate covered with a metal oxide film, having the above thickness is preferable because the thickness of the insulating layer can be made very small and thereby a capacitor of large capacity can be formed between the power layer and the ground layer.

The metal oxide film or the insulating resin film preferably has a relative dielectric constant of 2 or more in order to form a capacitor of large capacity.

The adhesive layer is preferably such that the adhesion strength between the intermediate layer and the power layer or the ground layer can be maintained at 1 kg/cm or more in terms of peeling strength. The adhesive layer can be made of an organic insulating adhesive and an organic conductive adhesive. These organic adhesives can be handled in the form of a film and has a feature that the control of thickness during adhesion is easy.

As the organic insulating adhesive, there can be mentioned known adhesives such as epoxy resin type, polyurethane resin type, silicone resin type, acrylic resin type, polyimide resin type, polyamide resin type, fluororesin type, phenolic resin type, polyester resin type, nitrile rubber type and the like. These adhesives can be used by adding thereto an inorganic fiber such as alumina fiber, glass fiber or the like, and a filler such as silica, alumina, mullite, aluminum nitride, silicon carbide, silicon nitride or the like.

As the organic conductive adhesive, there can be mentioned adhesives obtained by adding, to the above organic insulating adhesive, a conductive substance such as Au, Ag, Pd, Cu or the like.

The thickness of the insulating layer present in the second type intermediate layer is preferably 0.5–350 µm, particularly preferably 2–150 µm in order to make large the adhesion strength and the capacity of the capacitor formed between the power layer and the ground layer.

The above-described second type intermediate layer between the power layer and the ground layer, comprising an adhesive layer and a thin ceramic plate or a resin film present as an insulating layer in the adhesive layer, can be used in the packages of FIGS. 7 to 11 in place of the intermediate layer containing a ceramic insulating layer 39.

The third type intermediate layer is constituted substantially by an insulating adhesive layer alone. The adhesive layer acts as an insulating layer between a power layer and a ground layer.

As the adhesive for the adhesive layer, there can be mentioned, for example, the organic insulating adhesive and the inorganic insulating adhesive both mentioned previously.

Such a third type intermediate layer as an insulating layer, constituted substantially by an insulating adhesive layer alone can be used in the packages shown in FIGS. 7 to 11 in place of the intermediate layer containing a ceramic insulating layer 39.

In the fourth type intermediate layer, an insulating layer is formed on at least either of the opposing surfaces of the two electro-conductive members (the metals) present in the electro-conductive areas of a power layer and a ground layer, and an adhesive layer is present between the power layer and the ground layer.

Figure 13:
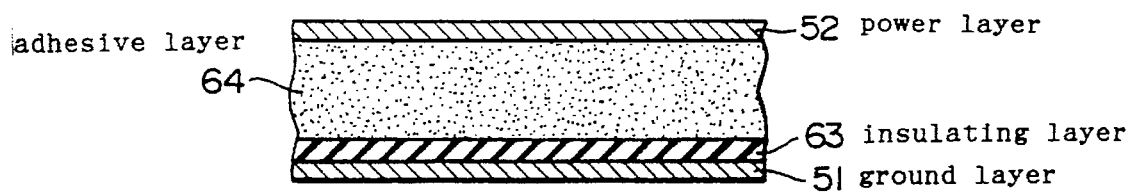
FIG. 13 is a schematic sectional view showing an example of the intermediate layer between the power layer and the ground layer.

FIG. 13 is a schematic sectional view when an insulating layer 63 is formed on the surface of a ground layer and a power layer 52 is laminated thereon via an adhesive layer 64.

In the packages of FIGS. 7 to 11, the intermediate layer present between the power layer 52 and the ground layer 51 can be replaced by the above-mentioned fourth type intermediate layer. As the method for forming an insulating layer on the surface of the metal of the electro-conductive area, there can be mentioned a method of forming a metal oxide film on the portion of the metal surface to contact with an adhesive layer, and a method of coating an insulating resin on said portion.

In the method of forming a metal oxide film on a metal surface, there can be formed an insulating layer which is a thin (about 0.1 µm) oxide film and which has a high dielectric constant; therefore, as compared with the case of the above embodiment of forming an insulating layer in the form of an insulating adhesive layer, a capacitor of high capacity can be formed between a power layer and a ground layer.

Incidentally, the metal of the electro-conductive member in the electro-conductive area and the metal of the metal oxide film to be formed on the surface of the former metal may be different or the same.

As the preferable material used for forming said oxide film, there can be mentioned Mg, Al, Ti, Zr, Hf, Nb, Ta and alloys containing these metals. Each of the oxide films made from these metals is preferable because it has a high relative dielectric constant and allows the formed capacitor to have a large capacity. Of said materials, particularly preferable in view of the electrical properties are Al and Ta. When the material is aluminum, there can be used, for example, high-purity aluminums (materials according to JIS: 1N90, 1N99, etc.) and aluminum alloys (materials according to JIS: 1085, 1080, 1060, 1100, 1200, 1N30, 2024, 5052, 5056, 6063, 7075, etc.).

The oxide film made from a high-purity aluminum, for example, an oxide film obtained by anodic oxidation of Al, has an electric resistivity of about $10^{15}$ Ω.cm in a dry state of 20° C. and about $10^{14}$ .cm at 200° C., and has sufficiently high electrical insulation.

Hence, the oxide film made from a high-purity aluminum can function sufficiently as the insulating layer of the present package because the insulating layer of the present package functions sufficiently when it has an electric resistivity of $10^8$ Ω.cm or more at room temperature.

As the method for forming a metal oxide film on a metal surface, known methods can be employed with no particular restriction. There can be preferably used, for example, a method of heating at a high temperature in an oxidizing atmosphere including $O_2$, $H_2O$, $CO_2$, etc.; a method of conducting anodic oxidation by an electrochemical means; and a method of conducting a chemical treatment. Of the metal oxide films formed by these methods, the metal oxide film formed by anodic oxidation is preferable because it has high electrical insulation, a high hardness and yet a porous structure containing fine pores and consequently can easily achieve blackening necessary for package appearance.

As the method for coating an insulating resin on a metal surface, there can be employed, for example, a method of applying, to a given area of a metal surface, a solution of an insulating resin dissolved in a solvent or a paste containing a curable insulating resin, by a means such as spin coating, screen printing, spraying, electrodeposition, immersion or the like to form an insulating resin film; and a method of thermally fusion-bonding an insulating resin powder or an insulating resin film. It is possible to beforehand add, to the insulating resin, a ceramic substance such as $TiO_2$, $PbTiO_3$—$PbZrO_3$, $BaTiO_3$ or the like.

In the second to fourth type intermediate layers between the power layer and the ground layer, the adhesion strength between the power layer and the ground layer is preferably 1 kg/cm or more, particularly preferably 1.5 kg/cm or more in terms of 90° peeling strength. Owing to such a high adhesion strength, the throughholes provided in the power layer and ground layer of the conventional package are unnecessary. Consequently, the self-inductances of the power layer and the ground layer are low.

In the second to fourth type intermediate layers, the capacity of the capacitor formed between the power layer and the ground layer is preferably 110 pF or more, particularly preferably 200–5,000 pF for lower noise.

Each of the above-mentioned first to fourth type intermediate layers between the power layer and the ground layer can be used also as an intermediate layer between the power layer and the signal layer or between the ground layer and the signal layer.

In the present invention, a substrate can be provided outside the power layer or the ground layer in contact with the power layer or the ground layer. Generally, the substrate is laminated in contact with the power layer or the ground layer via the above-mentioned insulating adhesive layer.

Owing to the presence of the substrate, the intermediate layer between the power layer and the ground layer, when the intermediate layer is any of the second to fourth types, can be formed so as to have a thickness of very high accuracy. As a result, it is possible to form a very thin intermediate layer of 350 µm or less stably and form a capacitor of high capacity between the power layer and the ground layer with good reproducibility.

Figure 14:
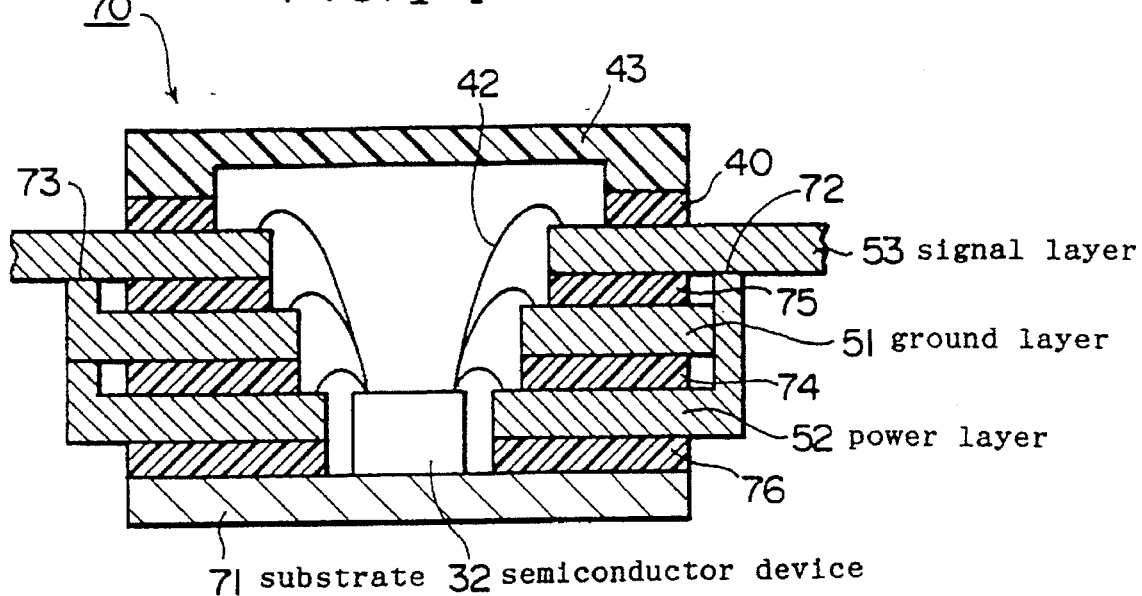
FIG. 14 is a schematic sectional view showing an embodiment of the package of the present invention for mounting of semiconductor device.
Figure 15:
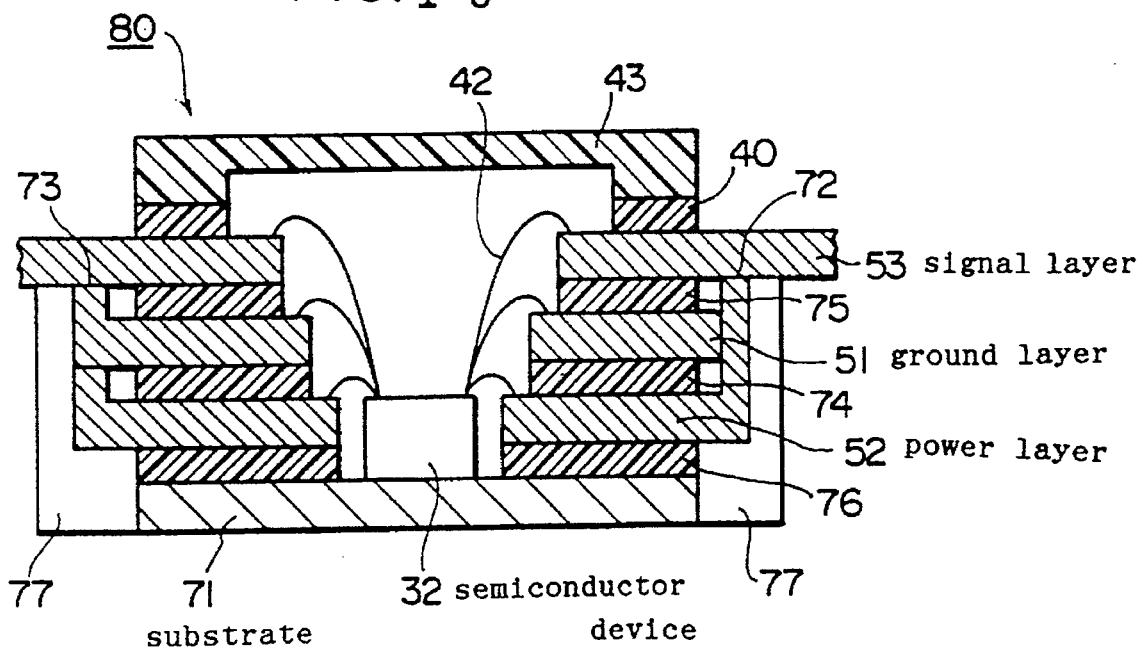
FIG. 15 is a schematic sectional view showing an embodiment of the package of the present invention for mounting of semiconductor device.

FIGS. 14 and 15 are each a schematic sectional view showing an embodiment of the present package having a substrate. In the package 70 shown in FIG. 14, a semiconductor device 32 is bonded onto a substrate 71, and a power layer 52 is adhered to the substrate by the use of an adhesive layer 76. In the package, the outer leads of the power layer 52 are electrically bonded to the leads 72 and 73 of a signal layer, not used for signal line. 74 and 75 each refer to an intermediate layer (an insulating layer), and 40, 42 and 43 refer to the same materials as in FIG. 7.

In the schematic sectional view of a package 80, shown in FIG. 15, 77 is an insulating material made of a resin or the like. In the package 80, therefore, the portion below the signal layer is covered with the insulating material 77.

The substrate is not particularly restricted as long as it has such a bending strength that the substrate is not substantially deformed by a pressure applied on the surface when a power layer, a ground layer or the like is adhered thereon by the use of an adhesive layer.

In general, the substrate is formed by the use of a known material so as to have such a thickness as to satisfy the above property. As the material, there can be used metals such as Cu, Ag, Au, Be, mg, Zn, Cd, Al, Ga, In, Tl, Ge, Sn, Pb, Sb, Bi, Ti, Zr, Hf, V, Nb, Ta, Cr, Mo, W, Mn, Tc, Re, Fe, Co, Ni, Ru, Rh, Pd, Os, Ir, Pt, La, Ce, Pr, Nd, Pm, Sm, Eu, Gd, Tb, Dy, Ho, Er, Tm, Yb, Lu and the like; and alloys containing these metals.

Typical examples of the material are as follows. In the case of Al, there can be used, for example, high-purity aluminums (1N90, 1N99, etc. specified by JIS H 4170) and aluminum alloys (1085, 1080, 1060, 1100, 1200, 1N80, 2024, 8052, 6063, 7075, etc. specified by JIS H 4000 or JIS H 4100). In the case of Cu, there can be used, for example, oxygen-free coppers (C-1020 and C-1011 specified by JIS H 3100 or JIS H 35101), tough pitch copper (material according to JIS: C-1100), Zr—Cu alloy [material according to JIS: C-151 (0.05–0.154% Zr-remainder of copper)], Fe—Cu alloy [material according to JIS: C-194 (2.3% Fe-0.12% Zn-0.03% P-remainder of copper)]and Cr—Cu alloy [material according to JIS: OMCL-1 (0.3% Cr-0.1% Zr-0.05% Mg-0.02% Si-remainder of copper)]. There can Further be used alloys such as W—Cu alloy (Cu: 1–50% by weight), Mo—Cu alloy (Cu: 1–60% by weight) and the like, and clad plates such as Cu—Mo—Cu, Cu-Kovar-Cu, Cu-Invar-Cu and the like.

As the material for the substrate, there can be also be used, besides the above metals, ceramic materials such as aluminum nitride-based sintered material, silicon carbide-based sintered material, beryllia-based sintered material, alumina-based sintered material, magnesia-based sintered material, zirconium-based sintered material, zircon-based sintered material, mullite-based sintered material, crystallized glass, amorphous glass and the like: composite materials such as alumina fiber-reinforced aluminum, carbon fiber-reinforced plastic and the like; and so forth.

Of ceramics, those having 15 kg/mm$^2$ or more, a large Young's modulus of 2–5×10$^4$ kg/mm$^2$ and a relatively small thermal expansion coefficient of 3–10×10$^{-6°}$ C.$^{-1}$ is resistant to deformation by pressure and also causes small deformation by thermal expansion during the heat treatment of package: therefore, are preferable as the substrate of the present package.

When, of the above materials, a highly heat-conductive material having a heat conductivity of 100 W/mk or more, for example, one of the above metals, the aluminum nitride sintered material or the like is used as the substrate, it acts as a plate for releasing the heat of package and, as a result, a package for mounting of semiconductor device, of very high heat-spreadability can be obtained.

The substrate preferably has a fin shape for efficient heat spread. The fin shape is generally comb-tooth-like and may also be cylindrical, prism-like or the like.

When the substrate is made of a metal, it may be used by forming thereon an electrical insulating film such as oxide film, insulating resin film or the like by a known method.

The non-laminated surface of the substrate may not be necessarily exposed entirely and may be covered partially or entirely. For example, the package of FIG. 15 is an embodiment in which the sides of a substrate 71 are covered with an insulating material 77 made of an insulating resin or the like.

Thus by using a stiff substrate, a power layer, a ground layer and a signal layer can be laminated thereon via an adhesive layer with very high thickness accuracies and a package can be formed.

In the package of the present invention for mounting of semiconductor device, known structures can be employed for the structures of other portions, with no particular restriction.

For example, the power layer and the ground layer can be bonded to the leads of the lead frame for signal layer, not used for signal line, for example, by a means such as electrical welding (e.g. spot welding, arc welding or electron beam welding), laser welding, soldering, brazing, adhesion by conductive adhesive, ultrasonic bonding, pressure bonding or the like and can be lumped together on the lead frame. In the bonded state, the electrical communication between the power layer or the ground layer and the outside is conducted via the bonded leads of the lead frame.

Meanwhile, when conducted, for example, by welding, the bonding between the copper, copper alloy, aluminum or aluminum alloy forming the power layer and the ground layer and the Ni—Fe type alloy, Ni—Co—Fe type alloy, copper or copper alloy forming the lead frame can be conducted in a good state. The lead frame after bonding is bent in a gull wing form, J-bend form or the like by an ordinary method and is used for mounting.

In the package of the present invention, as shown in each Fig., a cap 43 can be provided at the opening portion via a sealing layer 40. When no cap is used, an insulating resin can be filled around the semiconductor device to effect sealing.

The package of the present invention for mounting of semiconductor device can generally be produced, for example, by, as specifically shown in Examples, laminating, on a stiff substrate, electro-conductive layers each consisting of a thin metal plate processed so as to have a given shape, such as power layer, ground layer, signal layer (lead frame) and the like in a given order via adhesive layers.

The present invention is hereinafter described more specifically by way of Examples.

EXAMPLE 1

A package for mounting of semiconductor device, having a sectional structure as shown in FIG. 10 was produced according to the procedure described below.

There were prepared an aluminum nitride substrate (I) having a 39.2-mm square shape having a side of 39.2 mm, a thickness of 0.635 mm, and no throughholes; and an aluminum nitride substrate (II) having the same shape and the thickness as the substrate (I), a 21.5-mm square space having a side of n21.5 mm, at the center, and no throughholes.

Hereinafter, "A-mm square" refers to "a square having a side of A mm".

The aluminum nitride substrate (I) becomes a substrate 54 of the package shown in FIG. 10. The aluminum nitride substrate (II) becomes an insulating layer (a ceramic layer) 39.

On one side of the aluminum nitride substrate (I) and also on the both sides of the aluminum nitride substrate (II) was coated a paste of an active metal brazing material powder composed of 40% by weight of Ag, 57% by weight of Cu and 3% by weight of Ti, in a thickness of 40 μm.

Separately, there were prepared a copper plate (I) having a 38.8-mm square, a thickness of 150 μm, and a 18.5-mm square space at the center; and a copper plate (II) having the same shape and thickness as the substrate (I), and a 21.8-mm square space at the center. Each of these copper plates had, at the four sides, 32 (in total) outer leads each having a width of 0.3 mm.

In the copper plates (I) and (II), the inner lead areas are, respectively, an area interposed by a 18.5-mm square and a 21.5-mm square, present at the center, and an area interposed by a 21.8-mm square and a 23.8-mm square, present at the center. The outer lead areas are each an area interposed between a 38.8-mm square and a 50-mm square.

The copper plate (I) becomes a power layer 52, and the copper plate (II) becomes a ground layer 51.

Lamination was conducted in the order of the aluminum nitride substrate (I), the copper plate (I), the aluminum nitride substrate (II) and the copper plate (II). The resulting material was heated in vacuum at 890° C. for 20 minutes for bonding, to obtain a laminate. On the exposed area of the copper plate (II) of the laminate, other than the outer lead area was formed a thin aluminum film having a thickness of 2 μm, by vapor deposition. Thereon was coated a paste of a lead borosilicate type glass of low thermal expansion (LS-30-51 and LS-0451, produced by Nippon Electric Glass Co., Ltd.), followed by baking.

Thereon was placed a lead frame for signal, having 232 leads, followed by heating to solidly fix the lead frame. The lead frame is made of a Ni—Co—Fe alloy of low thermal expansion (Kovar®); the thickness was 150 μm; the width of each outer lead was 0.3 mm; the pitch of the outer leads was 0.65 mm; and Al was vapor-deposited on the inner lead area in a thickness of 2 μm.

Then, the outer leads of the power layer [the copper plate (I)] and the ground layer [the copper plate (II)] were welded to the 64 outer leads of the lead frame for signal, not used for signal line; only the lead frame for signal was bent in the form of a gull Wing towards the cavity-down direction; and the outer lead portion of the lead frame for signal was subjected to Sn plating.

The package of the present invention obtained by the above procedure was measured for self-inductances of power layer and ground layer. Incidentally, in the following Examples and Comparative Examples, self-inductance is a value obtained from the measurement mentioned previously.

A semiconductor device was mounted by the use of an Ag-charged glass; then, Al wire (diameter: 30 μm) bonding was conducted by an ultrasonic method; and there was measured simultaneous switching noise generating in Vcc (power), GND (ground) and leads (or pins).

There was further measured the capacity of the capacitor formed between the power layer and the ground layer. This capacitor acts as a by-pass capacitor of power line. The results of the above measurements are shown in Table 1a. There were furthermore measured the 90° peeling strengths between the power layer and the insulating layer and between the ground layer and the insulating layer. These results are also shown in Table 1a.

For comparison, the conventional package 1 shown in FIGS. 1a to FIG. 1d was measured for self-inductance of power layer or ground layer, noise amount, capacity of capacitor formed between power layer and ground layer, adhesion strength between power layer or ground layer and adhesive tape, and proportion of area of electro-conductive member in electro-conductive area of power layer or ground layer. The results are shown in Table 1a.

TABLE 1a

|  | Package of conventional structure | Present product |
| --- | --- | --- |
| Inductance[1] (nH) | 2.6 | 0.28 |
| Noise amount (V) | 1.1 | 0.54 |
| Capacitor capacity (pF) | 87 | 260 |
| Adhesion strength (kg/cm, 90° peeling) | 0.4 | 17 |
| Proportion of electro-conductive member (area %) |  |  |
| Power layer | 88 | 100 |
| Ground layer | 87 | 100 |

[1] Measured at 50 MHz

Since the package of this Example is made of aluminum nitride and copper, the package has a low thermal resistance of 15° C./W in a still air state and has an excellent heat-spreadability.

Subsequently, a mullite-made cap was bonded by using, as a sealant, a material obtained by baking the above-mentioned lead borosilicate glass of low thermal expansion. The following tests were conducted to examine the reliability of the sealing.

1) Temperature cycling: −65° to 150° C. 1,000 cycles

2) Thermal shock: −65° to 150° C. 1,000 cycles

3) High-temperature baking: 180° C. 1,000 hours

4) Immersion in solder: room temp. to 260° C. 10 cycles

There was neither gross leak nor fine leak after any test. Further, the strength of Al wire bonding was high and the mode of breakage was wire breakage in most cases.

The package I used for comparison has the following structure. A power layer 3 is made of a 26-mm square flat copper plate having a thickness of 150 μm; and outwardly from the outer periphery of the 26-mm square extend two outer leads (three leads per side) each having a width of 0.3 mm and a length of 2 mm. A ground layer 4 is a 26-mm square having a thickness of 150 µm and has a 10.5-mm square space at the center; and outwardly from the outer periphery of the 26-mm square extend twelve outer leads (three leads per side) each having a width of 0.3 mm and a length of 2 mm. In each of the 26-mm square flat plates of the power layer 3 and the ground layer 4 are formed forty throughholes having a circular section of 1.5 mm in diameter. A signal layer 5 is a copper-made lead frame of number of 196 leads, having a shape shown in FIG. 6; the thickness is 150 µm; the width of each outer lead is 0.3 mm; and the pitch of the outer leads is 0.65 mm. The power layer 3 and the ground layer 4 are adhered by the use of a thermo-hardening polyimide tape 7 having a thickness of 38 µm, and the ground layer 4 and the signal layer 5 are adhered in the same manner. The outer leads extending outwardly from the outer periphery of each of the 26-mm squares of the power layer 3 and the ground layer 4 are welded to the leads for power and grounding, of the lead frame for signal. Inside the 9-mm square at the center of the copper plate for power is mounted a semiconductor device 2 having a thickness of 0.4 mm; and the semiconductor device is wire-bonded to the inner leads of the power layer 3, the ground layer 4 and the signal layer 5. The inner lead areas of the power layer 3, the ground layer 4 and the signal layer 5 are, respectively, an area interposed between a 9-mm square and a 10.5-mm square, an area interposed between a 10.5-mm square and a 12-mm square, and an area interposed between a 12-mm square and a 13.5-mm square, all present at the centers of said layers. The outside of such a structure is sealed with a molded black epoxy resin 9. The external shape of the package sealed with the epoxy resin is 3.5 mm in thickness and a 34-mm square. Outwardly from the outer periphery of the 34-mm square extend the number of 196 leads (49 leads per side) each having a length of 3.5 mm, to be connected with the outside. The electro-conductive areas of the power layer 3 and the ground layer 4 are, respectively, an area interposed between a 10.5-mm square and a 26-mm square and an area interposed between by a 12-mm square and a 26-mm square. The dimensions of the individual layers and their positions of the package 1 described above are shown in FIG. 1d.

EXAMPLE 2–4

Packages were obtained in the same manner as gin Example 1 except that the ceramic substrate having no throughholes was changed to those made of mullite (Example 2), silicon carbide (Example 3) and alumina (Example 4). In each of these packages, the proportion of electro-conductive member in electro-conductive area was 100% and the self-inductances of the power layer and the ground layer were nearly the same as those in Example 1.

Further, the capacitor capacity, adhesion strength and thermal resistance of each of the packages were as shown in Table 1b.

TABLE 1b

|  | Mullite (Example 2) | Silicon carbide (Example 3) | Alumina (Example 4) |
| --- | --- | --- | --- |
| Thermal resistance (°C./W) | 23 | 14 | 24 |
| Capacitor capacity (pF) | 220 | 750 | 290 |

TABLE 1b-continued

|  | Mullite (Example 2) | Silicon carbide (Example 3) | Alumina (Example 4) |
| --- | --- | --- | --- |
| Peeling strength (kg/cm) | 13 | 16 | 18 |

Sealing was conducted in the same manner as in Example 1, and there was no problem as to the reliability.

EXAMPLE 5

A package was produced in the same manner as in Example 1 except that the thin aluminum film used in Example 1 was changed to an Ag plating and that an electroless Ni plating (2.5 µm) was applied as a sublayer for the Ag plating. The package was measured for wire bonding property, electrical properties, heat-spreadability and reliability of sealing, which were equivalent to those in Example 1.

EXAMPLE 6

A package was produced in the same manner as in Example 1 except that the bonding of the copper plate was conducted not using the Ag—Cu—Ti active metal brazing material used in Example 1 but directly via the Cu—$O_2$ type eutectic formed at 1065°–1083° C. (As the aluminum nitride substrate, there was used an aluminum nitride substrate subjected beforehand to an oxidation treatment to form thereon a 1.2-µm alumina film.)

The package was measured for wire bonding property, electrical properties, heat-spreadability and reliability of sealing, which were equivalent to those in Example 1. The 90° peeling strengths between the power layer and the insulating layer and between the ground layer and the insulating layer were each 10 kg/cm.

EXAMPLE 7

A package was produced in the same manner as in Example 1 except that the copper plates used in Example 1 were changed respectively to two plates of a Zr—Cu alloy (Zr: 0.15%, Cu: remainder; CA-151%) and a Fe—Cu alloy (Fe: 2.3%, Zn: 0.12%, P: 0.03%, Cu: remainder; CA-194). The package was measured for wire bonding property, electrical properties, heat-spreadability and reliability of sealing, which were equivalent to those in Example 1. The 90° peeling strengths between the power layer and the insulating layer and between the ground layer and the insulating layer were each 17 kg/cm.

EXAMPLE 8

A package was produced in the same manner as in Example 1 except that the copper plate used in Example 1 was changed to a Ni—Co—Fe alloy (Kovar) plate having a thickness of 125 µm and the brazing material composition was changed to 40% by weight (Ag), 55% by weight (Cu) and 5% by weight (Ti).

The package was measured for wire bonding property, electrical properties, heat-spreadability and reliability of sealing, which were equivalent to those in Example 1 except that the self-inductance of the power line showed a tendency of slight increase (about 0.33–0.3 nH; frequency 50 MHz). The 90° peeling strengths between the power layer and the insulating layer and between the ground layer and the insulating layer were each 8.5 kg/cm.

EXAMPLE 9

The power layer and the ground layer used in Example 1 were changed to those shown by the plan view of FIG. 4. That is, there were used a power layer and a ground layer each divided into four portions by linear non-electroconductive gaps 16 each having a width of 1.5 mm. Except for that, the procedure of Example 1 was repeated.

The proportion of the area of electro-conductive member in electro-conductive area was 93%. The self-inductances of the power layer and the ground layer were each 0.5 nH. Other electrical properties and the adhesion strength were about the same as those in Example 1.

EXAMPLE 10

A package for mounting of semiconductor device, having a structure shown in FIG. 14, was produced by the following procedure.

Figure 16:
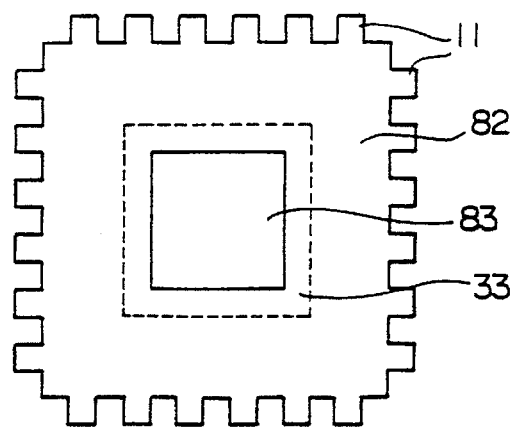
FIG. 16 is a plan view showing the copper plate for power layer, used in the package produced in Example 10.

There were prepared two thin metal plates (C-151 produced by Hitachi Cable, Ltd.) having a shape shown in FIG. 16, i.e. a 39-mm square thin copper plate (a power layer 52) having a thickness of 100 μm and a 19.5-mm square space 83 at the center and a thin copper plate (a ground layer 51) having the same thickness and size as the above copper plate and a 21.8-mm square space 83 at the center.

In each of these thin copper plates, 40 outer leads 11 (10 leads per side) each having a width of 0.2 mm extend outwardly so that when the two plates are laminated in such a way that the external forms fit with each other, the leads of one plate do not coincide with those of other plate.

On one side of each of the thin copper plates is provided a wire bonding area 33 as shown by the dotted line of FIG. 16, and the area is plated with Ag. The plating is applied to an area interposed between a 19.5-mm square and a 23.5-mm square in the case of the thin copper plate forming a power layer 52 and to an area interposed between a 21.8-mm square and a 25.8-mm square in the case of the thin copper plate forming a ground layer 51.

Next, there was prepared, as a stiff substrate 71, a black aluminum nitride sintered ceramic plate having a thickness of 1.0 mm and a 40-mm square shape.

On one side of the substrate 71 made of aluminum nitride was laminated a fluororesin adhesive film made of PFA (an ethylene tetrafluoride-perfluoroalkylvinyl ether copolymer) and having a thickness of 28 μm, to form an adhesive layer 76. At this time, the adhesive layer was formed on the portion of the substrate excluding the central 19.5-mm square and inner portion. Thereon was placed the thin copper plate for power layer 52 so that the side of the copper plate not plated with Ag came in contact with the adhesive layer, whereby the thin copper plate was adhered temporarily. The central 19.5-mm square and inner portion of the substrate 71 made of stiff aluminum nitride is a portion on which a semiconductor device 32 is to be mounted. The adhesion was conducted so that each of the four sides of the aluminum nitride substrate 71 was 0.5 mm outside from each of the four sides of the thin copper plate.

Then, on the thin copper plate for power layer 52, adhered onto the aluminum nitride substrate 71 was laminated the above-mentioned fluororesin adhesive film of different thickness in order to form an adhesive layer 74. This adhesive layer is formed on the portion of the thin copper plate excluding the central 21.8-mm square and inner portion. After the formation of the adhesive layer, thereon was placed the thin copper plate for ground layer 51 so that the side of the thin copper plate, not plated with Ag came in contact with the adhesive layer, whereby the thin copper plate was adhered temporarily. At this time, the adhesion of the thin copper plate for ground layer 51 was conducted so that its outer periphery coincided with that of the previously adhered thin copper plate having a 19.5-mm square space at the center.

In this case, the insulating layer between the power layer 52 and the ground layer 51 is constituted by the above-mentioned resin adhesive.

Next, the following operation was conducted in order to place a lead frame 53. On the thin copper plate for ground layer 51, adhered onto the substrate 71 was laminated the above-mentioned fluororesin adhesive film having a thickness of 28 μm; thereon was placed a polyimide film having a thickness of 125 μm so as to match the external form of the thin copper plate, whereby the polyimide film was adhered temporarily; on the polyimide film was laminated the above-mentioned fluororesin adhesive film. Lamination was conducted at the portion excluding the central 24-mm square and inner portion. The shape of the polyimide film is a 39-mm square having a 24-mm square space at the center. The two adhesive layers and the polyimide film interposed between the layers, together form an adhesive layer 75. Then, on the thus-formed adhesive layer 75 was mounted a copper-made lead frame (material: C-151 produced by Hitachi Cable, Ltd.) having the same shape as shown in FIG. 8, whereby the lead frame was adhered temporarily. In this lead frame, the outer leads 22 and the inner leads 24 each have a thickness of 150 μm; the pitch, width and length from tie-bar 21, of the outer leads 22 are 0.5 mm, 0.2 mm and 7 mm, respectively; and the total number of leads (pins) is 304. At the center is a 24-mm square space 27 free from any lead. The leads at the central portion interposed between a 24-mm square and a 27-mm square are plated with Ag, whereby a wired bonding area 28 is formed. In this way was formed a lead frame (signal layer) 53 shown in FIG. 14.

From above the power layer 52, the ground layer 51 and the lead frame 53 all adhered temporarily was applied a load of 20 kg/cm$^2$; curing was conducted at 350° C. for 1 hour; thereby, these three layers were adhered onto the substrate.

The outer leads 11 of the thus-formed power layer 52, ground layer 51 and substrate 71, present at their outer peripheries were bonded to the outer leads 22 of the lead frame 53 at bonding points 72 and 73, by electrical welding. The numbers of the welded outer leads of the copper plate for power layer 52 and the copper plate for ground layer 51 were each 40, and the total 80 (20 per side) leads of the lead frame 53 were used for bonding to the power layer and the ground layer. The bonding (welding) sites 72 and 73 are, at each of the four sides, 1 mm outside as measured from the outer periphery of the 40-mm square aluminum nitride substrate. The remaining (unbonded) 224 leads of the lead frame, are used mainly as a signal line.

Meanwhile, packages were produced in the same manner as above except that the above material (C-151) for lead frame was changed to 42 alloy (42% Ni-remainder of Fe), Kovar and four kinds of coppers, i.e. (1) oxygen-free copper (material according to JIS: C-1020), (2) OMCL-1 (a product of Mitsubishi Shindoh Co., Ltd.), (3) C-194 (a product of Olin & Co., Ltd.) and (4) EFTEC 64T (a product of Furukawa Electric Co., Ltd.). In these packages, the welding between the outer leads and the power layer 52 or the ground layer 51 both made of copper was good.

In this way was formed a package excluding a semiconductor device 32 and a cap 43. In this package structure, a micro-stripline is formed in the signal layer when the copper plate adjacent to the lead frame is used as the ground layer.

The package was measured for electrical properties. The results are shown in Table 2.

The self-inductances of the power layer 52 and the ground layer 51 as measured from the outer leads of the lead frame including the welded sites were each 0.3 nH. In Table 2 are shown the relations between the thickness of the adhesive layer 74 present between the power layer 52 and the ground layer 51 and the electrostatic capacity of the capacitor formed between the power layer 52 and the ground layer 51. As is clear from Table 2, the package of the present Invention can form a capacitor of large electrostatic capacity between the power layer and the ground layer.

Incidentally, the measured characteristic impedance ($Z^\circ$) of the signal lines [the inner leads at the center of the package: 8 mm (length) and 160 μm (average width)] formed by the leads of the leadframe was 50Ω.

Thus, it was shown that the multi-layer package of the present invention has excellent electrical properties.

TABLE 2

| Sample No. | Fluororesin adhesive layer (μm) | Electrostatic capacity (pF) |
|---|---|---|
| 1 | 2 | 16800 |
| 2 | 7 | 4900 |
| 3 | 28 | 1300 |
| 4 | 60 | 610 |
| 5 | 170 | 220 |

The 90° peeling strength between the power layer 52 or the ground layer 51 and the adhesive layer 74 forming the Intermediate layer between the above two layers was 4.3 kg/cm.

Subsequently, a semiconductor device 32 having a 17-mm square shape and a thickness of 0.4 mm was fitted by the use of an Ag-polyimide resin. Then, the semiconductor device was connected with the power layer 52, the ground layer 51 and the leads of the lead frame, used for signal line, by the use of a bonding wire 42 (a gold wire having a diameter of 30 μm), at 350° C. by thermo-pressing. Thereafter, there was prepared an aluminum plate having a 40-mm square shape and a thickness of 1.2 mm and having, at the center, a is cavity having a 28-mm square shape and a depth of 0.4 mm; on the surface of this aluminum plate was formed a black oxide film having a thickness of 13 μm, by anodic oxidation; thereby, a cap 43 was prepared. On the portion of the cap surrounded by a 28-mm square and a 40-mm square was coated, as a sealing layer 40, an epoxy adhesive in a thickness of 120 μm, followed by heat-curing, whereby the semiconductor device was sealed. Thus was completed a package having the structure shown in FIG. 14.

Figure 20:
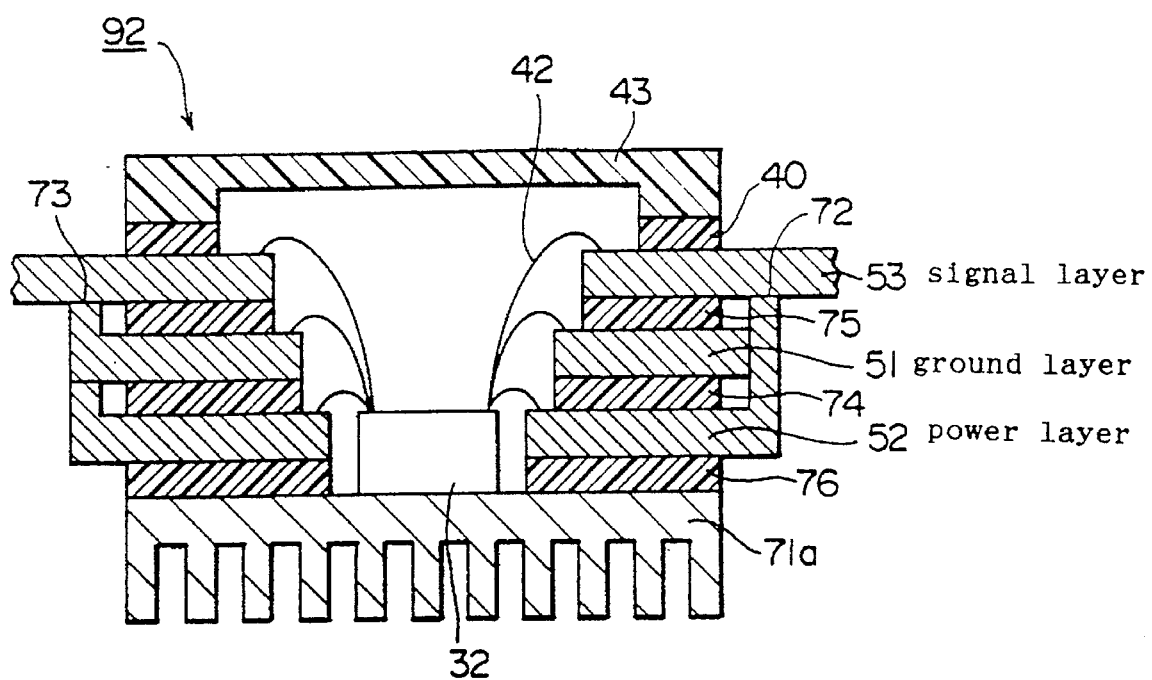
FIG. 20 is a schematic sectional view showing an embodiment of the package of the present invention for mounting of semiconductor device.

Next, a package having the structure shown in FIG. 20 was produced according to the following procedure.

A package for mounting of semiconductor device was produced in the same manner as used in the production of the package having the structure shown in FIG. 14, except that the aluminum nitride substrate 71 was changed to an aluminum nitride substrate 71a having an overall shape of 40-mm square, an overall height of 10 mm, a fin-portion thickness of 1.2 mm, a fin-portion height of 8 mm and 12 fins.

The two packages of the present Example, shown in FIG. 14 and FIG. 20 were examined for thermal resistance. The packages each had a small thermal resistance as shown in Table 3 and were excellent. Incidentally, thermal resistance were measured at a power consumption (of semiconductor device) of 8 W under still air cooling (a windless state) or flown air cooling (air flow rate: 3 m/sec).

TABLE 3

| | Thermal resistance (°C./W) | |
|---|---|---|
| | Still air cooling | Flown air cooling (3 m/sec) |
| Present package (no fin) | 15 | 5 |
| Present package (with fins) | 12 | 3.5 |

EXAMPLE 11

A package 91 for mounting of semiconductor device, having a structure shown in FIG. 14 was produced by the following procedure.

There were prepared two thin metal plates having a shape shown in FIG. 16, i.e. a 39-mm square thin aluminum plate (a power layer 52) having a thickness of 100 μm and a 17.5-mm square space 83 at the center and a thin aluminum plate (a ground layer 51) having the same thickness and size as the above aluminum plate and a 19.8-mm square space 83 at the center.

In each of these thin aluminum plates, 40 outer leads 11 (10 leads per side) each having a width of 0.2 mm extend outwardly so that when the two plates are laminated in such a way that the external forms fit with each other, the leads of one plate do not coincide with those of other plate.

In the thin aluminum plate for power layer 52, the area interposed between a 17.5-mm square and a 21.5-mm square becomes an inner lead area (a wire bonding area); and in the aluminum plate for ground layer 51, the area interposed between a 19.8-mm square and a 23.8-mm square becomes an inner lead area (a wire bonding area). In each plate, the area outside a 39-mm square becomes an outer lead area.

Next, there was prepared, as a stiff substrate 71, an aluminum plate having a thickness of 1.2 mm and a 40-mm square shape and having, on the surface, a black oxide film of 13 μm (thickness) formed by anodic oxidation. The substrate had a surface resistance of $3.8 \times 10^{11}$ Ω at 20° C. Herein, surface resistance refers to a resistance of a 0.5-mm gap when two opposing electrodes are formed by using silver paste on the surface of the substrate over the substrate width (40 mm) with a 0.5-mm gap provided between the electrodes.

Figure 19:
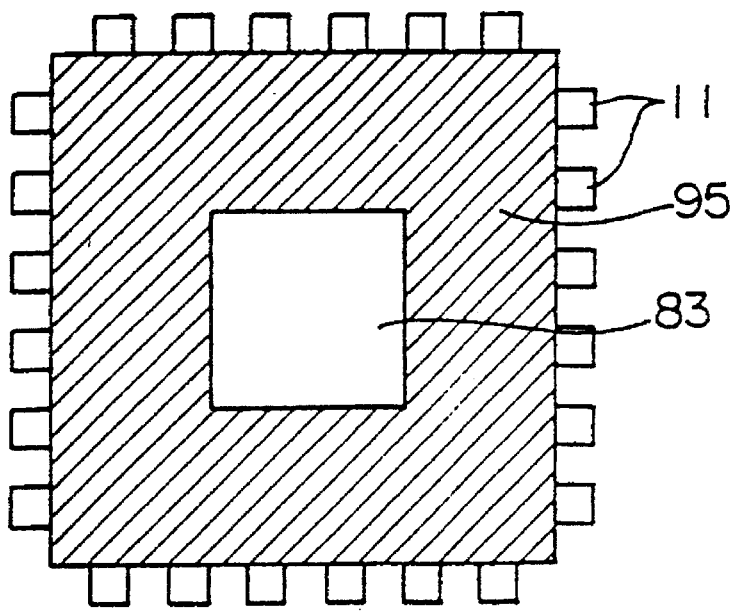
FIG. 19 is a plan view showing the thin aluminum plate for ground layer, used in the package produced in Example 12.

There was further prepared aluminum plates shown in FIG. 19, each having a thickness of 0.5 mm, a 40-mm square shape and a 19.8-mm square space at the center and each having, on the whole surface including the flank, a black oxide film 95 of different thickness formed by anodic oxidation. Each of these aluminum plates is used as an intermediate layer (an insulating layer) 92 placed between the power layer 52 and the ground layer 51. Onto one side of the aluminum substrate 71 was applied an epoxy resin adhesive in the thickness of 38 μm by screen printing, to form an adhesive layer 76. At this time, the 17.5-mm square and inner portion at the center was not subjected to screen printing. On the epoxy adhesive side was placed the thin aluminum plate for power layer 52 to adhere the thin aluminum plate temporarily. The central 17.5-mm square and inner portion of the aluminum substrate 71 is an area on which a semiconductor device 32 is to be mounted. The adhesion was conducted so that the four sides of the aluminum substrate were 0.5 mm outside from the four sides of the thin aluminum plate.

Then, on the thin aluminum plate for power layer 52, adhered onto the aluminum substrate 71 was coated, by the use of a dispenser, an Ag-epoxy resin electro-conductive adhesive for formation of an adhesive layer 74, in a thickness of 38 µm. The coating of the adhesive was made on the portion excluding the central 19.8-mm square and inner portion.

After the coating of the adhesive, there was placed the above-mentioned aluminum plate for formation of an intermediate layer (an insulating layer) 92, having, on the surface, a black oxide film of different thickness formed by anodic oxidation, whereby the aluminum plate was adhered temporarily. Subsequently, on the aluminum plate was coated the same Ag-epoxy electro-conductive adhesive in a thickness of 28 µm, whereby an adhesive layer 74 was formed. The adhesive was coated on the whole surface of the aluminum plate except for the central space portion, i.e. the 19.8-mm square and inner portion. On the adhesive was placed the above-mentioned aluminum plate for ground layer 51, for temporary adhesion. At this time, the adhesion of said aluminum plate was conducted so that its outer periphery coincided with that of the previously-adhered thin aluminum plate for power layer 52.

In this case, the insulating layer between the power layer 52 and the ground layer 51 is constituted by the aluminum oxide film formed by anodic oxidation.

Next, on the thin aluminum plate for ground layer 51 was coated an epoxy resin adhesive in a thickness of 210 µm. This epoxy resin adhesive forms an adhesive layer 75. Then, on the thus-formed adhesive layer 75 was mounted a 42 alloy-made lead frame (42% Ni-remainder of Fe) having the same shape as shown in FIG. 6, whereby the lead frame was adhered temporarily. In this lead frame, the outer leads 22 and the inner leads 24 each have a thickness of 150 µm; the pitch, width and length from tie-bar, of the outer leads 22 are 0.5 mm, 0.2 mm and 7 mm, respectively; and the total number of leads (pins) is 304. At the center is a 22-mm square space 27 free from any lead. The leads at the central portion interposed between a 22-mm square and a 25-mm square are plated with Ag, whereby a wire bonding area 28 is formed. In this way was formed a lead frame (signal layer) 53 shown in FIG. 17.

From above the power layer 52, the intermediate layer 92, the ground layer 51 and the lead frame 53 all adhered temporarily was applied a load of 10 g/cm$^2$; curing was conducted at 150° C. for 3 hours; thereby, these four layers were adhered onto the aluminum substrate 71.

The outer leads 11 of the thus-formed power layer 52, ground layer 51 and substrate 71, present at their outer peripheries were bonded to the outer leads 22 of the lead frame 53 at bonding points 72 and 73, by electrical welding. The numbers of the welded outer leads of the thin aluminum plate for power layer 52 and the thin aluminum plate for ground layer 51 were each 40, and the total 80 (20 per side) leads of the lead frame 53 were used for bonding to the power layer and the ground layer. The bonding (welding) points 72 and 73 are, at each of the four sides, 1 mm outside as measured from the outer periphery of the 40-mm square aluminum substrate. The remaining (unbonded) 224 leads of the lead frame, are used mainly as a signal line.

Meanwhile, packages were produced in the same manner as above except that the above material (42 alloy) for lead frame was changed to Kovar and five kinds of coppers, i.e. (1) oxygen-free copper (material according to JIS: C-1020), (2) C-151 (a product of Hitachi Cable, Ltd.), (3) OMCL-1 (a product of Mitsubishi Shindoh Co., Ltd.), (4) C-194 (a product of Olin & Co., Ltd.) and (5) EFTEC 64T (a product of Furukawa Electric Co., Ltd.). In these packages, the welding with the outer leads of the power layer 52 or the ground layer 51 both made of aluminum was good.

In this way was formed a package excluding a semiconductor device 32 and a cap 43. In this package structure, a micro-stripline is formed in the signal layer when the aluminum plate adjacent to the lead frame is used as the ground layer.

The package was measured for electrical properties. The results are shown in Tables 4 and 5. Although not shown in these tables, the self-inductances of the power layer 52 and the ground layer 51 as measured from the outer leads of the lead frame including the welded sites were each small (below 0.4 nH).

In Table 4 are shown the relations between the electrostatic capacity of the capacitor formed between the power layer 52 and the ground layer 51 (the intermediate layer 92 exists between the two layers) and the thickness of the oxide film (formed by anodic oxidation) present on the surface of the intermediate layer. As is clear from Table 4, the package of the present Example can form a capacitor of large electrostatic capacity between the power layer and the ground layer. Also, the Intermediate layers 4 each having thereon an oxide film formed by anodic oxidation, used in the package samples No. 1–8 of Table 4 had surface resistances of $10^{10}$–$10^{13}$ Ω at 20° C. The method for measurement of surface resistance is the same as in the case of the aluminum substrate 71 used in this Example.

Incidentally, the measured characteristic impedance ($Z_o$) of the signal lines [the inner leads at the center of the package: 8 mm (length) and 160 µm (average width)] formed by the leads of the lead frame 53 was 50Ω.

TABLE 4

| Sample No. | Thickness of oxide film formed by anodic oxidation (µm) | Electrostatic capacity (pF) |
| --- | --- | --- |
| 1 | 0.6 | 47500 |
| 2 | 2.0 | 19400 |
| 3 | 6.0 | 7100 |
| 4 | 13 | 3400 |
| 5 | 20 | 2200 |
| 6 | 50 | 1000 |
| 7 | 120 | 360 |
| 8 | 300 | 136 |

Subsequently, a semiconductor device 32 having a 15-mm square shape and a thickness of 0.4 mm was fitted by the use of an Ag-epoxy resin electro-conductive adhesive. Then, the semiconductor device was connected with the power layer 52, the ground layer 51 and the leads of the lead frame 53, used for signal line, by the use of a bonding wire 42 (an aluminum wire containing 1% of Si, having a diameter of 30 µm), at room temperature by an ultrasonic method. Thereafter, there was prepared an aluminum plate having a 40-mm square shape and a thickness of 1.2 mm and having, at the center, a cavity having a 28-mm square shape and a depth of 0.4 mm; on the surface of this aluminum plate was formed a black oxide film having a thickness of 13 µm, by anodic oxidation; thereby, a cap 43 was prepared. On the portion of the cap surrounded by a 28-mm square and a 40-mm square was coated, as a sealing layer 40, an epoxy adhesive in a thickness of 120 µm, followed by heat-curing, whereby the semiconductor device was sealed. Thus was completed a package 91 having the structure shown in FIG. 17.

Figure 17:
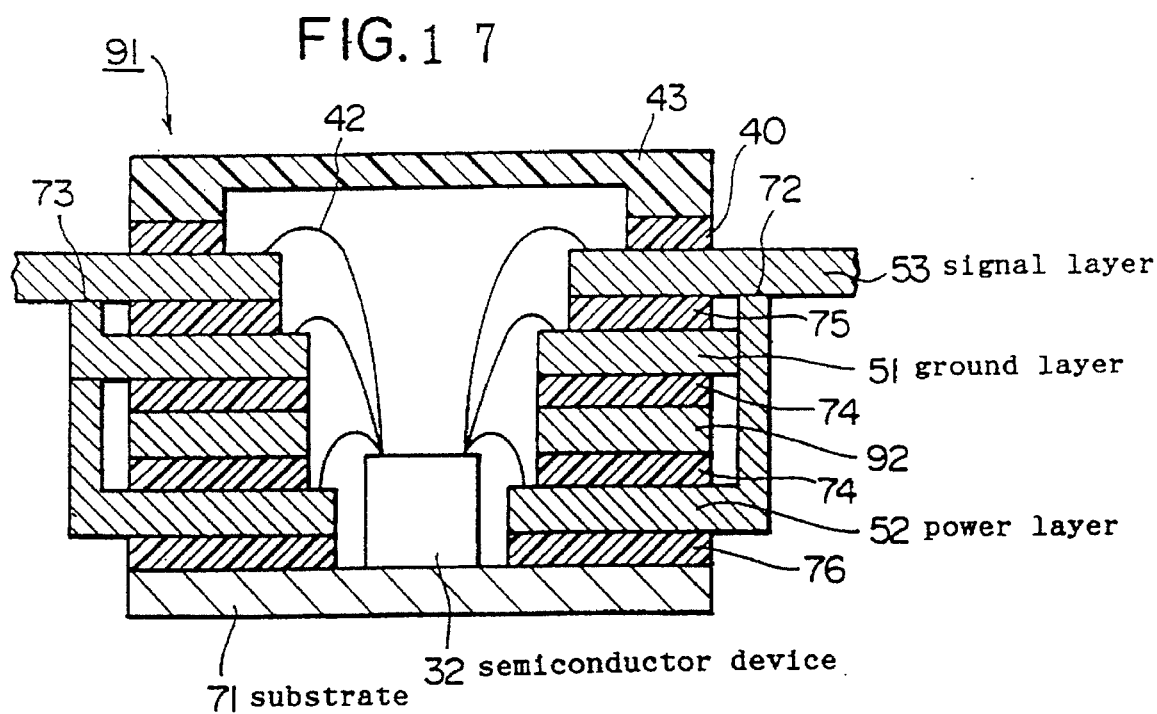
FIG. 17 is a plan view showing the copper plate for power layer, used in the package produced in Example 10.

Next, a package having the structure shown in FIG. 17 was produced by using, as the aluminum-made intermediate layer 92 placed between the power layer 52 and the ground layer 51, the aluminum intermediate layer having thereon a black oxide film (formed by anodic oxidation) having a thickness of 6 µm and, as the adhesive layer 74, an ordinary epoxy resin (thickness: 15 µm) in place of the Ag-epoxy resin electro-conductive adhesive. The package was measured for the electrostatic capacity of the capacitor formed between the power layer 52 and the ground layer 51. The electrostatic capacity was small as compared with the case when the Ag-epoxy resin electro-conductive adhesive was used, but was sufficiently large (1,100 pF) as compared with the package of conventional structure. In this case, the insulating layer between the power layer 52 and the layer 7 is constituted by the aluminum oxide film (formed by anodic oxidation) and the epoxy resin adhesive layer. The 90° peeling strengths between the power layer and the intermediate layer and between the ground layer and the intermediate layer were each 2.4 kg/cm.

EXAMPLE 12

A package for mounting of semiconductor device, having the structure shown in FIG. 14 was produced as follows. It was produced in the same manner as in Example 10 except that there were changes in materials, as described in the following (1) to (7) and changes in production conditions, as described in (8) and (9).

(1) There was prepared, as a stiff substrate 71, an aluminum plate having a thickness of 1.2 mm and a 40-mm square shape and having thereon a 13-µm thick black oxide film formed by anodic oxidation. The substrate has a surface resistance of $3.8 \times 10^{11}$ Ω at 20° C., which is the same as in Example 3.

Figure 18:
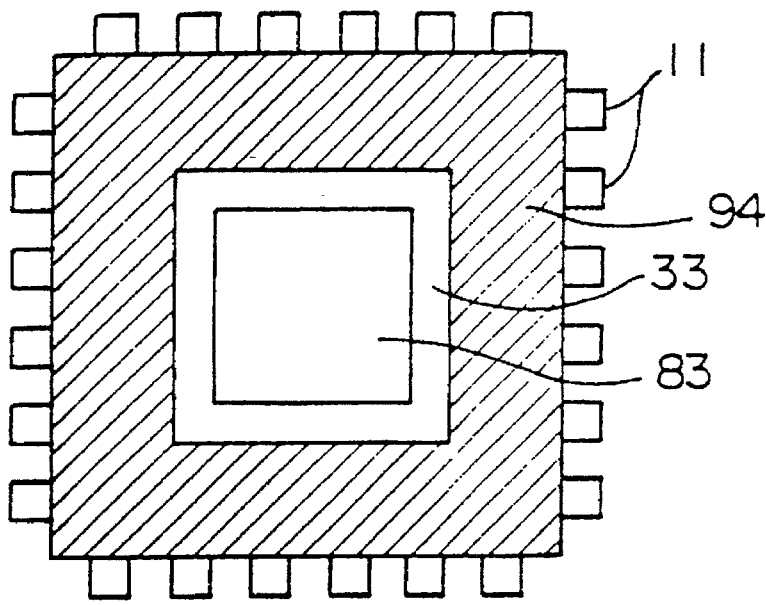
FIG. 18 is a plan view showing the thin aluminum plate for power layer, used in the package produced in Example 12.

(2) There was prepared, as a power layer, a thin aluminum plate as shown in FIG. 16, having a thickness of 100 µm and a 39-mm square shape having, at the center, a 19.5-mm square space 38. On one side of the thin aluminum plate and on the portion excluding the wire bonding area 88 and the outer leads 11, i.e. the slanting line portion 94 of FIG. 18 is formed an oxide film (formed by anodic oxidation) of different thickness. The other side of the thin aluminum plate on which no oxide film is formed, is used as a side to be adhered to the substrate.

(3) There was prepared, as a ground layer, a thin aluminum plate as shown in FIG. 16, having a thickness of 100 µm and a 89-mm square shape having, at the center, a 21.8-mm square space 83. On one side of the thin aluminum plate and on the portion excluding the outer leads 11, i.e. the slanting line portion 95 of FIG. 19 is formed an oxide film (formed by anodic oxidation) of different thickness. This side of the thin aluminum plate on which an oxide film is formed by anodic oxidation, is used as a side to be adhered to the power layer. On the flanks of these thin aluminum plates which come into contact with an adhesive layer 74 is formed an oxide film formed by anodic oxidation, over the entire thickness of 100 µm.

(4) There was coated, as an adhesive layer 76, an epoxy resin adhesive in a thickness of 38 µm.

(5) There was coated, as an adhesive layer 74, an Ag-epoxy resin electro-conductive adhesive in a thickness of 28 µm.

(6) There was used, as an adhesive layer 75, an epoxy resin adhesive in a thickness of 230 µm.

(7) As an adhesive for fitting a semiconductor device to the substrate 71, there was used an Ag-epoxy resin electro-conductive adhesive.

(8) The curing conditions for finally adhering the temporarily adhered power layer 52, ground layer 51 and lead frame (signal layer) 53 were changed to 160° C. ×3 hours.

(9) Wire bonding was changed from gold wire, 350° C. and thermopress-bonding method to aluminum wire containing 1% of silicon, room temperature and ultrasonic method.

In this way was produced a package as shown in FIG. 14.

The package was measured for electrical properties. The results are shown in Tables 5 and 6.

Table 5 shows the self-inductances of the power layer 52 and the ground layer 51 as measured from the outer leads of the lead frame including the welded sites. As is clear from Table 5, also when aluminum is used for the power layer and the ground layer, low self-inductances similar to those of Example 10 can be obtained and are definitely smaller than those of conventional multi-layer alumina ceramic package obtained by co-firing or conventional multi-layer plastic package. In Table 6 are shown the relations between the electrostatic capacity of the capacitor formed between the power layer 52 and the ground layer 51 and the thickness of the oxide film (formed by anodic oxidation) present on the surfaces of the power layer 52 and the ground layer 51. As is clear from Table 6, the package of the present Example, as compared with the package of Example 3, can form a capacitor of larger electrostatic capacity between the power layer 52 and the ground layer 51. Also, the power layer 52 and the ground layer 51 each having thereon an oxide film formed by anodic oxidation, used in the package samples No. 1-7 of Table 6 had surface resistances of $10^{10}$–$10^{13}$ Ω at 20° C. The method for measurement of surface resistance is the same as in the case of Example 11.

Incidentally, the measured characteristic impedance ($Z_o$) of the signal lines [the inner leads at the center of the package: 8 mm (length) and 200 µm (average width)] formed by the leads of the lead frame was 50 Ω. The 90° peeling strengths between the power layer and the intermediate layer and between the ground layer and the intermediate layer were each 2.4 kg/cm.

TABLE 5

|  | Self-inductance (nH) |
|---|---|
| Thin aluminum plate for power layer | 0.4 |
| Thin aluminum plate for ground laye | 0.4 |

TABLE 6

| Sample No. | Thickness of oxide film formed by anodic oxidation (µm) | Electrostatic capacity (pF) |
|---|---|---|
| 1 | 0.6 | 110000 |
| 2 | 2.0 | 42500 |
| 3 | 6.0 | 14200 |
| 4 | 13 | 6900 |
| 5 | 24 | 3700 |
| 6 | 50 | 1700 |
| 7 | 100 | 900 |
| 8 | 130 | 620 |

EXAMPLE 13

A package for mounting of semiconductor device, having the structure shown in FIG. 14 was produced as follows. It was produced in the same manner as in Example 10 except that there were changes in materials, as described in the following (1) to (6).

(1) There was used, as an adhesive layer 76, a polyimide film having a 25-mm thick fluororesin adhesive layer on the both sides and having a total thickness of 75 μm and a 19.5-mm square space at the center.

(2) There was used, as an adhesive layer (an intermediate layer) 74, a 39-mm square polyimide film of different thickness having a 7.5-mm thick fluororesin adhesive layer on the both sides and having a 21.8-mm square space at the center.

(3) There was used, as an adhesive layer (an intermediate layer) 75, a 39-mm square polyimide film having a 25-pm thick fluororesin adhesive layer on the both sides and having a total thickness of 175 μm and a 24-mm square space at the center.

(4) An epoxy-novolac resin was filled into the gap of the adhered lead frame.

(5) The fitting of a semiconductor device 32 to the package was conducted by the use of an Ag-epoxy resin adhesive.

(6) The wire bonding between the semiconductor device and the package was conducted by the use of an aluminum wire containing 1% of silicon, having a diameter of 30 μm, at room temperature by an ultrasonic method.

The thus obtained package was measured for the self-inductances of the power layer 52 and the ground layer 51, which were the same as in Example 10. The package was also measured for the electrostatic capacity of the capacitor formed between the power layer and the ground layer, and the results are shown in Table 7.

TABLE 7

| Sample No. | Thickness of polyimide film (μm) | Electrostatic capacity between power layer and ground layer (pF) |
| --- | --- | --- |
| 1 | 2.5 | 1600 |
| 2 | 7 | 1300 |
| 3 | 16 | 1030 |
| 4 | 50 | 520 |
| 5 | 125 | 240 |
| 6 | 200 | 160 |

As shown above, the present package, as compared with the conventional plastic package, could form a capacitor of high capacity between the power layer and the ground layer.

The package obtained in this Example was also measured for thermal resistance in the same manner as in Example 10. The results were the same as those shown in Table 3 of Example 10 and the package had excellent heat-spreadability.

The characteristic impedances of the signal lines were 50 Ω. The peeling strengths between the power layer and the intermediate layer and between the ground layer and the intermediate layer were each 2.5 kg/cm.

EXAMPLES 14–16

Packages each having the structure shown in FIG. 14 were produced in the same manner as in Example 10 except that:

(1) the material for power layer 52 and ground layer 51 was changed from the thin aluminum plate to Al (Example 14), an Al-clad 42% Ni—Fe alloy (Example 15) and an Al-clad Kovar (Example 16), and (2) as the adhesive for adhesive layer, there were used a thermoplastic polyimide adhesive (Examples 14 and 16) and an epoxy resin adhesive (Example 15).

Each of the packages was measured for the self-inductances of the power layer 52 and the ground layer 51, as well as for the capacity of the capacitor formed between the two layers. The results were nearly the same as those obtained in Example 10.

The 90° peeling strength between the power layer 52 or the ground layer 51 and the adhesive layer 74 present between the two layers was 6.7 kg/cm (Example 14), 3.1 kg/cm (Example 15) and 2.0 kg/cm (Example 16).

Industrial Applicability

The package of the present invention for mounting of semiconductor device is low in power line and ground line noise and compact and can therefore be used preferably as a package for mounting of semiconductor device, used in microprocessors, gate arrays, etc. of high operational frequency.

I claim:

1. A packaging for mounting of a semiconductor device, which comprises a power layer, a ground layer and a signal layer, wherein:

(a) the power layer, the ground layer and the signal layer are laminated via an intermediate layer including an insulating layer, (b) the power layer and the ground layer are each constituted by an inner lead area, an outer lead area and an electro-conductive area, the inner lead area and the outer lead area are not covered with the intermediate layer to be exposed and the electro-conductive area is interposed between the inner lead area and the outer lead area and covered with the intermediate layer, (c) substantially all of the electro-conductive area of each of the power layer and the ground layer is constituted by a planar electro-conductive member, and the electro-conductive area has substantially no throughhole, (d) the intermediate layer between the power layer and the ground layer comprises one of the following (1), (2), (3) and (4), (1) a ceramic insulating layer and an inorganic adhesive layer, (2) an organic adhesive layer and an insulating layer present therein, (3) an inorganic adhesive layer or an organic adhesive layer alone, (4) an inorganic adhesive layer or an organic adhesive layer and an insulating layer formed on the surface of at least either of the electro-conductive members present in the electro-conductive areas of the power layer and the ground layer, with a proviso that said inorganic adhesive layer consists essentially of a noble metal brazing alloy or a Cu—$O_2$ type eutectic crystal, (e) the power layer and the ground layer are laminated adjacently via the intermediate layer and adhesive strengths between the power layer and the intermediate layer and between the ground layer and the intermediate layer are each 1 kg/cm or more in terms of 90° peeling strength, and (f) the package is used substantially without being subjected to resin sealing after mounting of the semiconductor device.

2. The package set forth in claim 1, wherein at least 90% of the electro-conductive area of each of the power layer and the ground layer is constituted by an electro-conductive member.

3. The package set forth in claim 1, wherein the signal layer and the power layer each have a self-inductance of (2 nH or less).

4. The package set forth in claim 1, wherein the lamination is made in the order of:

the ground layer, the power layer and the signal layer.

5. The package set forth in claim 1, wherein the intermediate layer between the power layer and the ground layer comprises a ceramic insulating layer and an inorganic adhesive layer.

6. The package set forth in claim 5, wherein the ceramic insulating layer has a thickness of (30 μm or more).

7. The package set forth in claim 1, wherein the intermediate layer between the power layer and the ground layer comprises an organic adhesive layer and an insulating layer present therein.

8. The package set forth in claim 7, wherein the insulating layer is a (thin ceramic plate or an insulating resin film).

9. The package set forth in claim 7, wherein the insulating layer is a metal plate whose both surfaces are covered with a (metal oxide film or an insulating resin film).

10. The package set forth in claim 7, wherein the power layer and the ground layer form a capacitor which has a capacity of 110 pF or more.

11. The package set forth in claim 1, wherein the intermediate layer between the power layer and the ground layer is constituted substantially by an adhesive layer alone.

12. The package set forth in claim 11, wherein the power layer and the ground layer form a capacitor which has a capacity of 110 pF or more.

13. The package set forth in claim 1, wherein the intermediate layer between the power layer and the ground layer comprises an adhesive layer and an insulating layer formed on the surface of at least either of the electro-conductive members present in the electro-conductive areas of the power layer and the ground layer.

14. The package set forth in claim 13, wherein the insulating layer is a metal oxide film or an insulating resin film.

15. The package set forth in claim 13, wherein the capacitor formed by the power layer and the ground layer has a capacity of 110 pF or more.

16. The package set forth in claim 1, wherein a substrate is provided and the power layer or the ground layer is laminated on at least one side of the substrate.

17. The package set forth in claim 1, which is used substantially without being subjected to resin sealing after mounting of semiconductor device.

18. The package set forth in claim 1, wherein the lamination is made in the order of:

the power layer, the ground layer and the signal layer.

19. The package set forth in claim 1, wherein the lamination is made in the order of:

the ground layer, the power layer and the signal layer.

20. A packaging for mounting of a semiconductor device, which comprises a power layer, a ground layer, a signal layer and a substrate, wherein:

(a) the power layer, the ground layer and the signal layer are laminated via an intermediate layer including an insulating layer, (b) the power layer and the ground layer are each constituted by an inner lead area, an outer lead area and an electro-conductive area, the inner lead area and the outer lead area are not covered with the intermediate layer to be exposed and the electro-conductive area is interposed between the inner lead area and the outer lead area and covered with the intermediate layer, (c) substantially all of the electro-conductive area of each of the power layer and the ground layer is constituted by a planar electro-conductive member, and the electro-conductive area has substantially no throughhole, (d) the intermediate layer between the power layer and the ground layer comprises one of the following (1), (2), (3) and (4), (1) a ceramic insulating layer and an inorganic adhesive layer, (2) an organic adhesive layer and an insulating layer present therein, (3) an inorganic adhesive layer or an organic adhesive layer alone, (4) an inorganic adhesive layer or an organic adhesive layer and an insulating layer formed on the surface of at least either of the electro-conductive members present in the electro-conductive areas of the power layer and the ground layer, with a proviso that said inorganic adhesive layer consists essentially of a noble metal brazing alloy or a Cu—$O_2$ type eutectic crystal, (e) the power layer and the ground layer are laminated adjacently via the intermediate layer and adhesive strengths between the power layer and the intermediate layer and between the ground layer and the intermediate layer are each 1 kg/cm or more in terms of 90° peeling strength, and (f) the power layer or the ground layer is laminated on at least one side of the substrate and a portion for fixing the semiconductor device is provided on the same side.

21. The package set forth in claim 20, wherein the package is used substantially without being subjected to resin sealing after mounting of the semiconductor device.

* * * * *